United States Patent
Coumou

(10) Patent No.: US 9,041,471 B2
(45) Date of Patent: *May 26, 2015

(54) POWER DISTORTION-BASED SERVO CONTROL SYSTEMS FOR FREQUENCY TUNING RF POWER SOURCES

(71) Applicant: MKS Instruments, Inc., Andover, MA (US)

(72) Inventor: David J. Coumou, Webster, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/044,547

(22) Filed: Oct. 2, 2013

(65) Prior Publication Data

US 2014/0028389 A1    Jan. 30, 2014

Related U.S. Application Data

(63) Continuation of application No. 13/339,494, filed on Dec. 29, 2011, now Pat. No. 8,576,013.

(51) Int. Cl.
| | | |
|---|---|---|
| H03F 3/191 | (2006.01) | |
| H03F 1/56 | (2006.01) | |
| H03F 1/32 | (2006.01) | |
| H03F 3/189 | (2006.01) | |

(52) U.S. Cl.
CPC .................. *H03F 1/56* (2013.01); *H03F 3/191* (2013.01); *H03F 1/32* (2013.01); *H03F 3/189* (2013.01)

(58) Field of Classification Search
USPC .......................................... 330/285, 302, 305
See application file for complete search history.

(56) References Cited

U.S. PATENT DOCUMENTS

| | | | |
|---|---|---|---|
| 5,223,457 A | 6/1993 | Mintz et al. | |
| 5,383,019 A | 1/1995 | Farrell et al. | |
| 5,654,679 A | 8/1997 | Mavretic et al. | |
| 5,688,357 A | 11/1997 | Hanawa | |
| 5,892,198 A | 4/1999 | Barnes et al. | |
| 6,020,794 A | 2/2000 | Wilbur | |
| 6,326,584 B1 | 12/2001 | Jewett et al. | |
| 6,392,210 B1 | 5/2002 | Jewett et al. | |
| 7,839,223 B2 | 11/2010 | Van Zyl et al. | |
| 8,294,514 B2 * | 10/2012 | Visser et al. | 330/305 |
| 8,717,104 B1 * | 5/2014 | Williams | 330/305 |
| 2006/0232471 A1 | 10/2006 | Coumou | |
| 2007/0139122 A1 | 6/2007 | Nagarkatti et al. | |
| 2009/0315463 A1 | 12/2009 | Coumou | |

* cited by examiner

*Primary Examiner* — Khanh V Nguyen
(74) *Attorney, Agent, or Firm* — Harness, Dickey & Pierce, P.L.C.

(57) ABSTRACT

A radio frequency system includes a power amplifier that outputs a radio frequency signal to a matching network via a transmission line between the power amplifier and the matching network. A sensor monitors the radio frequency signal and generates first sensor signals based on the radio frequency signal. A distortion module determines a first distortion value according to at least one of (i) a sinusoidal function of the first sensor signals and (ii) a cross-correlation function of the first sensor signals. A first correction circuit (i) generates a first impedance tuning value based on the first distortion value and a first predetermined value, and (ii) provides feedforward control of impedance matching performed within the matching network including outputting the first impedance tuning value to one of the power amplifier and the matching network.

52 Claims, 16 Drawing Sheets

POWER DISTORTION-BASED SERVO CONTROL SYSTEMS FOR FREQUENCY TUNING RF POWER SOURCES

CROSS-REFERENCE TO RELATED APPLICATIONS

This application is a continuation of U.S. patent application Ser. No. 13/339,494 filed on Dec. 29, 2011. The entire disclosure of the above application is incorporated herein by reference.

FIELD

The present disclosure generally relates to a radio frequency (RF) generator and, more particularly, to frequency control of a RF generator.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator, a matching network and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

Heuristic, feedback or feedforward approaches are typically used to control a RF generator to maximize power transferred to the matching network. Heuristic approaches include a set of rules that are used to direct a gradient based search method to provide a sensed response satisfying a predetermined criterion. A heuristic approach can include performing a search to tune frequency of a power amplifier circuit to minimize reverse power, increasing a step size of a search space, changing direction of the search, and initiating or ceasing a search. Heuristic approaches cannot be represented by a transfer function.

A feedback approach typically includes a feedback loop, which is used to minimize error between a power setpoint and an amount of power transferred from a RF generator and a matching network. The feedback loop may include sensors and a control module. The control module adjusts output power of an agile frequency RF power source (or power amplifier). The sensors may detect voltage, current, forward power and/or reverse power out of the power amplifier and generate sensor signals. An amount of power transferred or a difference between the forward power and the reverse power is determined. An error signal is generated based on this difference. The control module may generate a power control signal based on the error signal. The power amplifier generates RF power signals based on the power control signal from the control module. Although this approach minimizes error in power to maximize power transferred from the RF generator to the matching network, this approach is limited to adjusting power that cannot minimize non-zero reflected power.

Another feedback approach includes detecting a phase difference between sensor signals, which are generated based on a voltage and current output of the power amplifier. Frequency of the power amplifier is adjusted via a voltage-controlled oscillator in response to the detected phase difference to minimize the phase difference and/or reverse power. The phase difference based frequency adjustment approach can lead to a quantitative error, which is associated with a systematic variation in a RF power system. Systematic variations may include a phase error (or phase offset), a mismatched load, a misalignment in RF signal delivery associated with tune and load parameters of the matching network, etc. The systematic variations can prevent the phase difference from being reduced to zero and/or a reflection coefficient as plotted on a Smith chart from reaching a (0,0) point. The systematic variations can also prevent a required power transfer to a load. As a result, a calibration scheme is needed to prevent a phase offset and/or a heuristic approach is needed to minimize these systematic variations. Also, when adjusting frequency of a power amplifier based on phase, a directivity signal is needed to determine which direction to adjust the frequency to minimize the phase difference.

Yet another feedback approach detects forward power and reverse power. Frequency of a power amplifier is adjusted via a voltage-controlled oscillator based on the forward power and the reverse power to minimize the reverse power. Phase information is not utilized in this approach to minimize the reverse power.

In one feedforward approach, a feedforward loop is used to adjust capacitance of a capacitor in a matching network. Sensors are used to detect forward power and reverse power. A processor adjusts operation of a motor to change the capacitance of the capacitor based on outputs of the sensors. The processor adjusts the capacitance until the reverse power is at a minimum level.

SUMMARY

A radio frequency system is provided and includes a power amplifier that outputs a radio frequency signal to a matching network via a transmission line between the power amplifier and the matching network. A sensor monitors the radio frequency signal and generates first sensor signals based on the radio frequency signal. A distortion module determines a first distortion value according to at least one of (i) a sinusoidal function of the first sensor signals and (ii) a cross-correlation function of the first sensor signals. A first correction circuit (i) generates a first impedance tuning value based on the first distortion value and a first predetermined value, and (ii) provides feedforward control of impedance matching performed within the matching network including outputting the first impedance tuning value to one of the power amplifier and the matching network.

In other features, a method of operating a radio frequency system is provided and includes generating a radio frequency signal via a power amplifier. The radio frequency signal is outputted to a matching network via a transmission line between the power amplifier and the matching network. The radio frequency signal is monitored and sensor signals are generated based on the radio frequency signal. A first distortion value is determined according to at least one of (i) a sinusoidal function of the sensor signals and (ii) a cross-correlation function of the sensor signals. A first impedance tuning value is generated based on the first distortion value and a first predetermined value. Feedforward control of impedance matching performed within the matching network is provided and includes outputting the first impedance tuning value to one of the power amplifier and the matching network.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
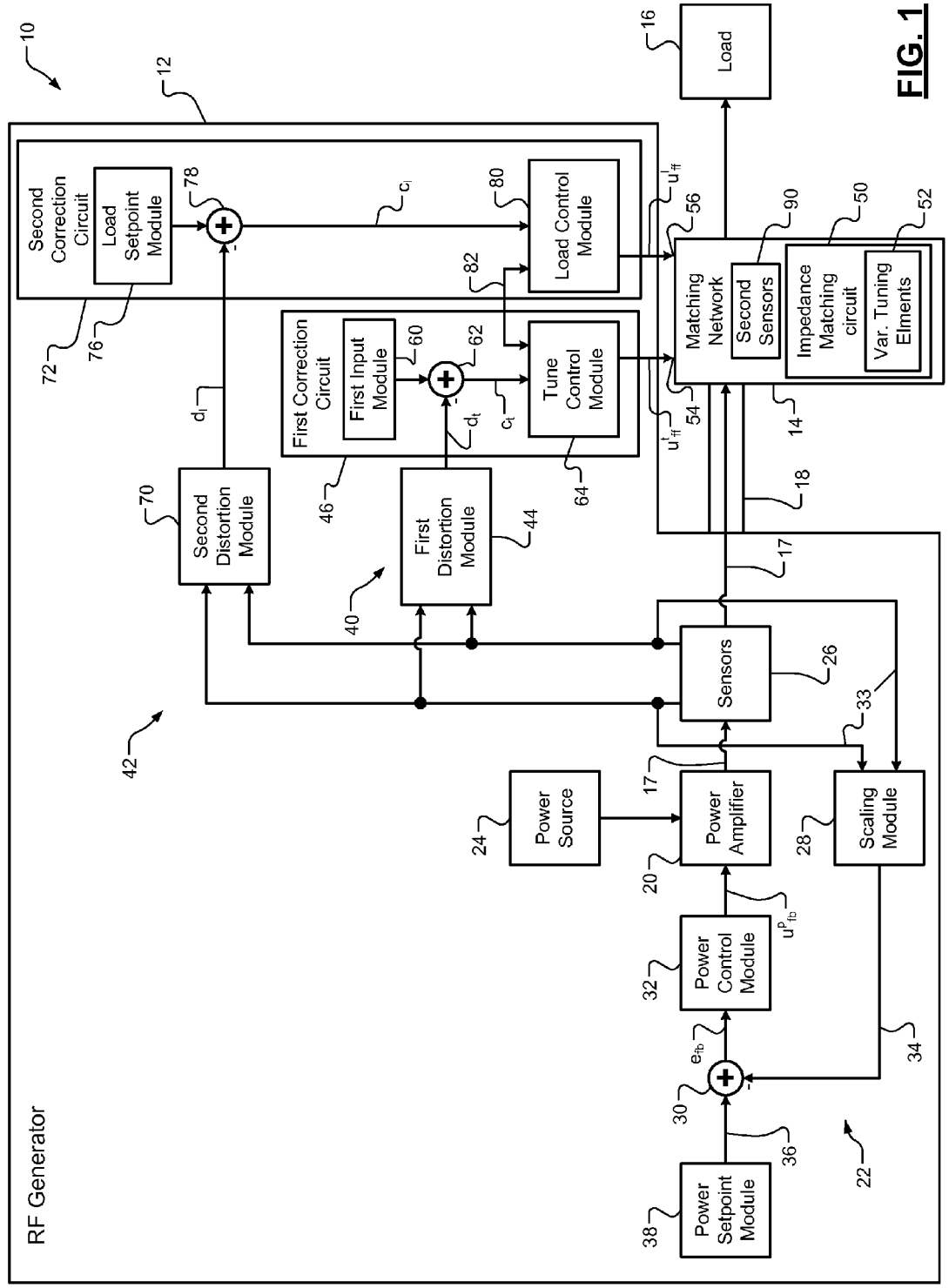
FIG. 1 is a functional block diagram of a RF power system incorporating feedforward control in accordance with the present disclosure.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Although the terms first, second, third, etc. may be used herein to describe various elements, components, loops, circuits, and/or modules, these elements, components, loops, circuits, and/or modules should not be limited by these terms. These terms may be only used to distinguish one element, component, loop, circuit or module from another element, component, loop, circuit or module. Terms such as "first," "second," and other numerical terms when used herein do not imply a sequence or order unless clearly indicated by the context. Thus, a first element, component, loop, circuit or module discussed below could be termed a second element, component, loop, circuit or module without departing from the teachings of the example implementations disclosed herein.

Various techniques are disclosed below to maximize power transferred between a power amplifier and/or RF power generator and a matching network of a RF power system. These techniques include feedforward control to servo tune an agile RF power source (referred to as a RF power generator). The feedforward control is used to correct distortion (or disturbance) within a RF power system. The distortion refers to and/or is directly related to an amount of power transferred to and/or reflected back from the matching network due to a reactive change in load impedance.

The disclosed techniques use the feedforward control in combination with feedback control. The feedforward control is used to minimize the distortion, whereas the feedback control, is used to minimize error in power output of the power amplifier. Feedback control is used to adjust power output of a power amplifier based on a difference between the power output and a predetermined power setpoint. The feedforward control does not affect closed-loop performance associated with the feedback control (and associated feedback transfer function).

Feedforward control is provided, as a feedback controller is limited to providing error correction adjustments when the error in power output is not equal to zero. This limits the ability of a feedback controller to minimize the distortion. Feedforward control minimizes distortion when the error is both equal to and not equal to zero. Feedforward control also differs from feedback control in that feedforward control includes distortion corrections independent of a predetermined power setpoint.

The feedforward techniques disclosed herein include detecting and correcting distortion of a RF power system. The feedforward control ameliorates overall control performance of a RF power system as a supplement to feedback control.

In FIG. 1, a RF power system 10 is shown. The RF power system 10 includes a RF generator 12, a matching network 14, and a load 16 of the matching network 14. The RF generator 12 generates a RF power signal 17, which is provided to the matching network 14. The matching network 14 matches an input impedance of the matching network 14 to a characteristic impedance of a transmission line 18 between the RF generator 12 and the matching network 14. Put another way, the matching network 14 matches an impedance of the load 16 to an impedance as seen by the output of the RF generator 12. The matching network 14 and the load 16 may be considered as the load on the RF generator 12. The load 16 may be, for example, a plasma chamber or other RF load. The impedance of the load 16 may be static (i.e. unchanging over time) or dynamic (i.e. changing over time).

The RF generator 12 includes a RF power source 20 (or a power amplifier) and a feedback loop 22. The power amplifier 20 generates the RF power signal 17, which is outputted to the matching network 14. The power amplifier 20 may generate the RF power signal 17 based on a power signal received from a power source 24 external to the power amplifier 20. Although the power source 24 is shown as part of the RF generator 12, the power source 24 may be external to the RF generator 12. The power source 24 may be, for example, a direct current (DC) power source.

The feedback loop 22 includes one or more sensors (first sensors) 26, a scaling module 28, a first summer 30, and a power control module 32. The sensors 26 may include voltage, current and/or directional coupler sensors. The sensors 26 may detect (i) voltage V and current I output of the power amplifier 20, and/or (ii) forward (or source) power $P_{FWD}$ out of the power amplifier 20 and/or RF generator 12 and reverse (or reflected) power $P_{REV}$ received from the matching network 14. The voltage V, current I, forward power $P_{FWD}$, and reverse power $P_{REV}$ may be scaled and/or filtered versions of the actual voltage, current, forward power and reverse power of the output of the power amplifier 20. The sensors 26 may be analog and/or digital sensors. In a digital implementation, the sensors 26 may include analog-to-digital (A/D) converters and signal sampling components with corresponding sampling rates.

The sensors 26 generate sensor signals 33, which are received by the scaling module 28. The scaling module 28 scales the sensor signals 26 and generates a power feedback signal 34. The power feedback signal 34 is generated based on the sensor signals 33 and a scaling matrix. The power feedback signal 34 may represent the forward power for forward power leveling deliver power. The power feedback signal 34 may represent the RF power transferred to the matching network 14 or load power $P_d$ and can be represented by equation 1, where V is voltage output of the power amplifier 20 and/or RF generator 12, I is current out of the power amplifier 20 and/or RF generator 12, and $\Theta$ is a phase difference between the voltage and the current outputs V, I of the power amplifier 20.

$$P_d=|V||I|\cos(\Theta)=P_{FWD}-P_{REV} \quad (1)$$

The first summer 30 sums the power feedback signal 34 with a predetermined power setpoint signal 36, which may be generated by a power setpoint module 38. The power feedback signal 34 may be subtracted from the predetermined power setpoint signal 36 to generate an error signal $e_{fb}$.

The power control module 32 receives the error signal $e_{fb}$ and generates a power control signal $u_{fb}^P$ to regulate power out of the power amplifier 20. The power control signal $u_{fb}^P$ is provided to the power amplifier 20. The power amplifier 20 adjusts the RF power signal 17 based on the power control signal $u_{fb}^P$. The RF power signal 17 may be a continuous waveform or a pulsed waveform. The servo control described herein allows for the RF power signal 17 to be pulsed due to the update rate associated with the servo control. The power control module 32 may include a proportional integral derivative (PID) controller and/or a direct digital synthesis (DDS) component(s). In one implementation, the power control module 32 is a first PID controller with a function identified as $D_{fb}^P(z)$. The power control signal $u_{fb}^P$ may be a drive signal and have a DC offset or rail voltage, a frequency and a phase. However, the power control signal $u_{fb}^P$ does not adjust frequency of the RF power signal 17.

The RF generator 12 may further include a first feedforward loop 40 and a second feedforward loop 42. The first feedforward loop 40 includes a first distortion module 44 and a first correction circuit 46. The first distortion module 44 determines a distortion value $d_t$ representative of the distortion as seen at the output of the power amplifier 20 and/or RF generator 12. The first distortion value $d_t$ is generated based on the sensor signals 33 and a distortion function. The distortion function is described in more detail below. The first correction circuit 46 generates a first power tuning value (or first impedance tuning value) $u_f^t$ based on the first distortion value $d_t$. The tuning value $u_f^t$ is provided to the matching network 14 for frequency response tuning and impedance adjusting purposes. The first distortion module 44 may determine the first distortion value $d_t$ based on a sinusoidal function and/or a cross-correlation function.

Sinusoidal Function

Multiple techniques are disclosed herein that include maximizing optimal power transfer in an RF power system with a dynamic load (i.e. a load having varying impedance(s)). A first technique, which is described with respect to FIGS. 1 and 3 includes the RF power source 20 connected to the matching network 14. The matching network 14 may include an impedance matching circuit 50 with two or more variable tuning elements 52 (e.g., variable capacitors). The variable tuning elements 52 may be in a 'L'-configuration (one capacitance in parallel with the RF generator 12 and one capacitance in series with the load 16). The variable tuning elements 52 are used for adjusting tune and load parameters of the matching network 14, and may have respectively an associated tune input 54 and load input 56. The tune and load parameters refer to impedance adjustments performed in the matching network 14 via the variable tuning elements 52. As an example, the tune parameter and the load parameter may be associated with respective capacitances of capacitors in the matching network 14.

Figure 2:
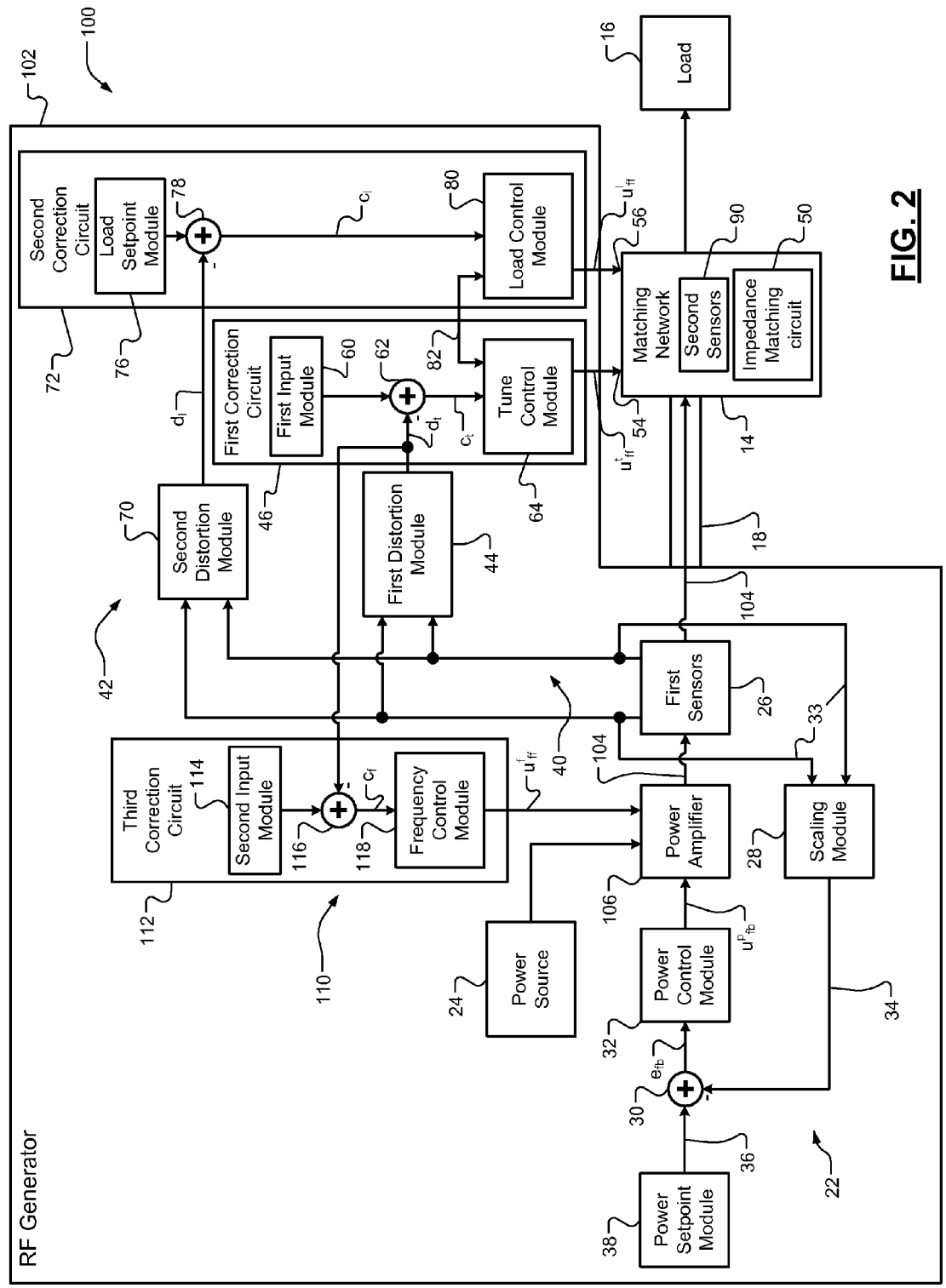
FIG. 2 is a functional block diagram of a RF power system incorporating feedforward control and power correction feedback control in accordance with the present disclosure.
Figure 4:
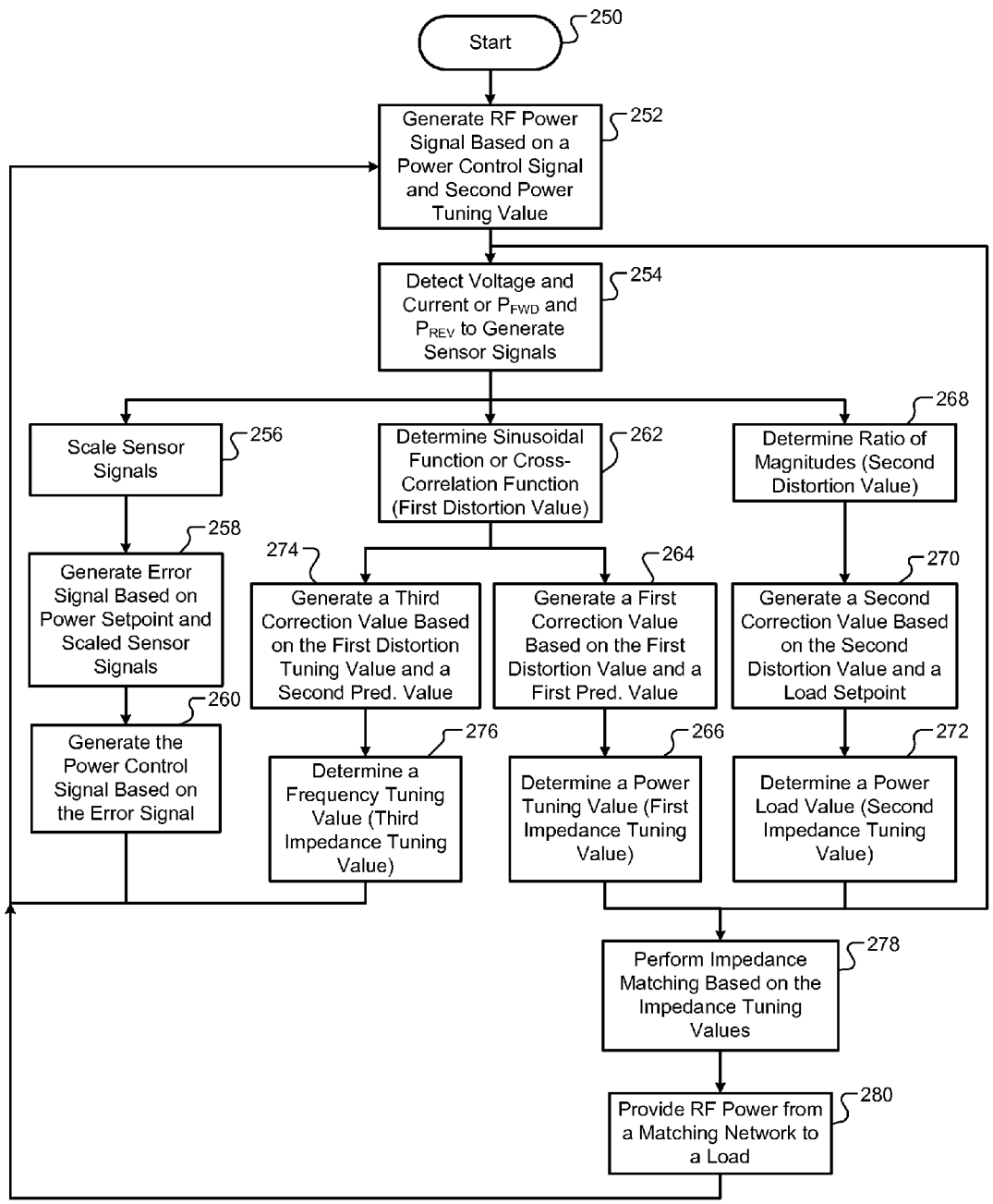
FIG. 4 illustrates a feedforward and feedback control method with frequency-based impedance matching feedforward control in accordance with the present disclosure.

A second technique, which is described with respect to FIGS. 2 and 4, introduces a variable frequency adjustment to the power amplifier 20 and may be used alternatively or in combination with the first technique. The tune and load parameters may each be fixed, discretely selectable, and/or adjustable when using the second technique.

In both the first and second techniques, the RF power transferred $P_d$ from the power amplifier 20 to the matching network 14 is maximized. This may occur when the forward power $P_{FWD}$ to the matching network 14 is maximized and/or the reverse power $P_{REV}$ from the matching network is minimized. The RF power transferred $P_d$ may be represented by equation 2. A maximum RF power transferred $P_{MAX}$ may be represented by equation 3.

$$P_d = |V||I|\cos(\Theta) \tag{2}$$

$$P_{MAX} = \max(|V||I|\cos(\Theta)) = \max(P_{FWD}) - \min(P_{REV}) \tag{3}$$

The RF power transferred $P_d$ is maximized when the phase $\Theta$ is as close to zero as systematically achievable for a RF power system 10 providing power to a reactive load or reactive impedance (e.g., the load 16). A reactive impedance refers to a load with changing impedance. The first and second techniques minimize the phase $\Theta$ by adjusting the tune and load parameters of the matching network 14. Since the phase $\Theta$ is dependent on the reactive impedance, reduction in the phase $\Theta$ is a function of frequency f of the power amplifier 20. As a result, phase reduction can be performed as a function of the frequency f or in other words, the phase $\Theta$ can be reduced to or nearly 0 by adjusting the frequency f of the power amplifier 20 and thus the output frequency f of the power amplifier 20. Frequency adjustment is provided by the implementations of FIGS. 2 and 4.

Although the first and second techniques can be used to minimize the phase $\Theta$, the techniques do not directly detect or adjust the phase $\Theta$. The techniques may include determining $\cos(\Theta)$ (referred to herein as "the cosine function"), $1-\sin^2\Theta$ (referred to herein as "the sine function"), and/or another primary and/or sinusoidal function. The phase $\Theta$ may be referred to as a secondary function. The first distortion value $d_t$ is determined via the first distortion module 44 using vector calculus without determining the phase $\Theta$. The first distortion value $d_t$ may be equal to and/or be represented by the sinusoidal function.

As an example, the cosine function $\cos(\Theta)$ for two independent variables X, Y may be represented by, for example, equation 4, where X may be voltage or reverse power, Y may be current or forward power, and $\langle XY \rangle$ is a dot product of X and Y.

$$\cos(\Theta) = \frac{\langle XY \rangle}{\|X\|_2 \|Y\|_2} \tag{4}$$

The sine function $1-\sin^2\Theta$ may be determined based on one of the equations 5 and 6.

$$\sin(\Theta) = \frac{|X \otimes Y|}{\|X\|_2 \|Y\|_2} \tag{5}$$

$$\sin(\Theta) = \frac{(|X\|Y| - \langle XY \rangle)^{\frac{1}{2}}}{\|X\|_2 \|Y\|_2} \tag{6}$$

One technique disclosed herein includes maximizing power transfer to the matching network 14 by maximizing the cosine function $\cos(\Theta)$. As an example, the variables X and Y may be substituted for voltage V and current I, and $\cos(\Theta)$ may be calculated directly using a closed form solution to control the frequency f of the power amplifier 20. The cosine function is maximized to maximize the power transferred. This technique may be performed digitally using, for example, digital circuitry and/or a PID controller.

An example analog technique includes using directional coupler sensors to detect the reverse power $P_{REV}$ and the forward power $P_{FWD}$. The variable X of expression 4 may be replaced with the reverse power $P_{REV}$ and the variable Y of expression 4 may be replaced with the forward power $P_{FWD}$. A reflection coefficient $\Gamma$ of the transmission line 18 is a function of the reverse power $P_{REV}$ and the forward power $P_{FWD}$. The reflection coefficient $\Gamma$ may be represented by the reverse power $P_{REV}$ divided by the forward power $P_{FWD}$ and or by equation 7, where $z_l$ is the impedance of the load on the RF generator 12 (i.e. the matching network 14 and the load 16) and $z_0$ is the impedance of the transmission line 18.

$$\Gamma = \frac{z_l - z_0}{z_l + z_0} \tag{7}$$

The techniques disclosed herein enable autonomous servo of an agile frequency RF power source (power amplifier 20) for maximized power transfer. Although servo control includes feedback and feedforward control, the feedforward control provided herein aids in quickly maximizing the power transferred to the matching network 14. These techniques include determining distortion of a RF power system (RF power system 10) and providing feedforward correction using vector calculus. The distortion refers to the reflected power due to the reactive change in load impedance, which is directly related to the sinusoidal function of the phase $\Theta$.

Cross Correlation

As an alternative to and/or in addition to using a sinusoidal function, a cross-correlation function may be used to determine the first distortion value $d_t$. The energy of a signal $s(t)$ may be represented by equation 8 using vector calculus, where t is time.

$$s(t) = \int_{-\infty}^{\infty} s^2(t) dt \qquad (8)$$

To compute energy for a change in load impedance or an arc disturbance of a load, the energy exhibited by a RF power system is based on two parameters. The two parameters may be determined based on signals from RF sensors (such as the sensors 26). The RF sensors may be, for example, voltage and current sensors or directional coupler sensors that are used to acquire voltage, current and/or power samples of a transmission line. Signals from the RF sensors are oscillating continuous time signals, which may be arbitrarily designated as $x(t)$ and $y(t)$, which correspond to the above variables X and Y. The corresponding digital version of these oscillating continuous time signals is $x(n)$ and $y(n)$. A discrete-time cross correlation value $r_{xy}(\tau)$ of the signals $x(n)$ and $y(n)$ may be represented by equation 9, where $\mu_x$ represents the average of the signal $x(n)$, $\mu_y$ represents the average of the signal $y(n)$, and $\tau$ represents an overlap of and/or shift in time between the signals $x(n)$ and $y(n)$.

$$r_{xy}(\tau) = \sum_{\forall n} (x[n] - \mu_x)(y[n-\tau] - \mu_y) \qquad (9)$$

Power p associated with the two signals $x(n)$ and $y(n)$ can be determined when $\tau$ is equal to 0. The two signals $x(n)$ and $y(n)$ completely overlap in time when $\tau$ is equal to 0. Energy $E_{xy}$ for an impedance changing event can be represented by equation 10 and as a function of the power p, where b identifies a block number, $T_b$ is a duration time of each block, K is a total of non-overlapping blocks of samples of the two signals $x(n)$ and $y(n)$, and k identifies a current block and/or sample.

$$E_{xy} = T_b \sum_{k=1}^{K} (p[k] - p[k-1]) \qquad (10)$$

The dot product $\langle XY \rangle$ may be determined based on the cross-correlation value when $\tau$ is equal to 0. The dot product $\langle XY \rangle$ is directly related to the cross-correlation value when $\tau$ is equal to 0. Also, the power p (or $P_d$) is related to the dot product $\langle XY \rangle$ by substituting equation 2 into equation 4. Based on the discrete-time cross correlation value $r_{xy}(\tau)$, the power p (or $P_d$), and the dot product $\langle XY \rangle$ the distortion value of the sinusoidal function (e.g., the cosine function or the sine function) may be determined based on vector calculus.

The first distortion module 44 may determine the first distortion value $d_t$ based on the discrete-time cross correlation value $r_{xy}(\tau)$ when $\tau$ is not equal to 0. The first distortion module 44 may not determine the first distortion value $d_t$ based on the discrete-time cross correlation value $r_{xy}(\tau)$ when $\tau$ is equal to 0. As shown above, this cross-correlation technique may be used to derive a sinusoidal function between two wideband signals $x(t)$ (e.g., V or $P_{REV}$) and $y(t)$ (e.g., I or $P_{FWD}$), which is representative of characteristics of the transmission line 18.

The sinusoidal function may be used as described below for autonomous control of a variable frequency RF power source to maximize power transfer. The sinusoidal function is used in feedforward control to correct distortion impinged on power regulation when the frequency of the RF power source (or power amplifier) achieves a power transfer that is less than a maximum power transfer. This correction is immune to spectral interference due to harmonics or intermodulation distortion. For this reason, this technique is useful for dynamic load conditions and RF power applications requiring frequency tuning responses of a RF power source within a predetermined period (e.g., less than 3 microseconds (µs)) with a predetermined update rate (e.g., less than 1 µs). Frequency tuning of a RF power source is described primarily with respect to FIGS. 2 and 4.

Referring again to FIG. 1, in one implementation, the first correction circuit 46 includes a first input module 60, a second summer 62 and a tune control module 64 (or $D_{ff}^t(z)$). The first input module 60 may generate a first predetermined value (e.g., 0 when determining the distortion value $d_t$ according to the sine function or 1 when determining the distortion value $d_t$ according to the cosine function). The second summer 62 may subtract the first distortion value $d_t$ from the first predetermined value to generate a tuning or first correction value $c_t$. The tune control module 64 may include a second PID controller and generate a power tuning value (or first impedance tuning value) $u_{ff}^t$ based on the first correction value $c_t$. The tune control module 64 may adjust the power tuning value $u_{ff}^t$ to match the first distortion value $d_t$ with the first predetermined value. The tune control module 64 may generate and/or receive the first predetermined value.

The second feedforward loop 42 may include a second distortion module 70 and a second correction circuit 72. The second distortion module 70 determines a ratio of magnitudes (or second distortion value) $d_l$ based on the sensor signals 33 and a second distortion function. The second distortion function may be represented by equation 11.

$$d_l = \frac{\|X\|_2}{\|Y\|_2} \qquad (11)$$

The first and second distortion values $d_t$, $d_l$ each provide an indication of distortion and/or associated parameters, as measured by the sensors 33.

The second correction circuit 72 may include a load setpoint module 76, a third summer 78 and a load control module 80, which may be represented as a function $D_{ff}^l(z)$ The load setpoint module 76 may generate a predetermined load setpoint value (e.g., 50 Ohms ($\Omega$)). The third summer 78 may subtract the second distortion value $d_l$ from the load setpoint value to generate a load correction value (second correction value) $c_l$.

The load control module 80 may include a third PID controller and may generate a power load value (or second impedance tuning value) $u_{ff}^l$ based on the second correction value $c_l$. The load control module 80 may adjust the power load value $u_{ff}^l$ to match the second distortion value $d_l$ to the load setpoint value. The load control module 80 may generate and/or receive the load setpoint value.

The tune control module 64 and the load control module 80 are coupled, as represented by arrow 82. The arrow 82 represents a mutual coupling between the tune and the load inputs

54, 56 of the matching network 14. The power load value $u_{f\!f}^l$ is affected (or indirectly adjusted) when the power tune value $u_{f\!f}^l$ is directly adjusted by the tune control module 64. Similarly, the power tune value $u_{f\!f}^t$ is affected (or indirectly adjusted) when the power load value $u_{f\!f}^l$ is directly adjusted by the load control module 80. The tune and load inputs 54, 56 are adjusted respectively by the power tune value $u_{f\!f}^t$ and the power load value $u_{f\!f}^l$.

The matching network 14 may also include second sensors 90. The second sensors 90 may include phase and magnitude sensors, which are used by the impedance matching circuit 50 to adjust the tune and load inputs 54, 56. The impedance matching circuit 50 may adjust the tune and load inputs 54, 56 such that the load 16 and the matching network 14 have an impedance as seen by the power amplifier 20 and/or the RF generator 12 matching the impedance of the transmission line 18. The tune and load inputs 54, 56 may be adjusted until phase of the RF power signal 17 is 0 and impedance of the matching network 14 is at a predetermined impedance (e.g., 50Ω). This aids in minimizing the reverse power $P_{REV}$, which maximizes power transferred to the matching network 14. The second sensors 90 may be electrically coupled to the transmission line 18 and used to detect the distortion (or $P_{REV}$) of the RF power system 10. The tune and load adjustments performed by the impedance matching circuit 50 based on the outputs of the second sensors 90 do not need to fully maximize the power transferred, as the feedforward loops 40, 42 further aid in maximizing the power transferred.

The second sensors 90 may be located at an input of the matching network 14, not at an output of the matching network 14 to quantify the distortion of the RF power system 10 as a function of the reverse power $P_{REV}$. The impedance matching circuit 50 may apply a feedforward match correction $u_{f\!f}^m$ to correct an impedance mismatch between the matching network 14 and the transmission line 18. Collective power transfer contributions by the power control module 32 and the matching network 14 (and/or controller of the matching network 14) to power delivery may be analytically represented as a sum of the correction values provided by these controllers. This sum is provided by equation 12, where u is the total distortion correction.

$$u = u_{fb}^p + u_{f\!f}^m \quad (12)$$

The tune and load control modules 64, 80 provide the distortion corrections values $u_{f\!f}^t$ and $u_{f\!f}^l$, which are provided to the tune and load inputs 54, 56. The match correction value $u_{f\!f}^m$ may be expressed as a sum of these correction values, as represented by equation 13.

$$u_{f\!f}^m = u_{f\!f}^t + u_{f\!f}^l \quad (13)$$

Without the distortion correction of the matching network 14, there can be a loss in the RF power system 10 if feedback control is used without feedforward control. The second sensors 90 may be coupled to the transmission line 18 to measure the reverse power $P_{REV}$. The matching network 14 may not correct all of the distortion, as other feedforward control is provided via the feedforward loops 40, 42. The matching network 14 may adjust the tune and load inputs 54, 56 based on the reverse power $P_{REV}$. The distortion correction as performed by the matching network 14 may be limited and may not reduce the reverse power $P_{REV}$ to 0 due to model imperfections and/or a measurement error. The feedforward correction provided by the feedforward loops 40, 42 may further correct the distortion and reduce the reverse power $P_{REV}$ to 0.

To reduce the number of sensors incorporated in the RF power system 10, the first sensors or the second sensors may not be included. The remaining sensors included in the RF power system 10 and the corresponding signals and/or parameter actuators are accessible to the RF generator 12 and the matching network 14. As an example, sensor and controller consolidation may be achieved by deploying power delivery feedforward correction within the RF generator 12.

Autonomous Control of Agile RF Power Source

The phase of the signals x(t) and y(t) has a relationship, which may be represented by equation 14, where W is equal to the dot product $\langle XY \rangle$.

$$W = \|X\|_2 \|Y\|_2 \cos(\Theta) \quad (14)$$

The cosine function may be used to represent distortion upon which feedforward correction is based. This feedforward correction may be used when the sensors used to determine the distortion value of the cosine function are (i) voltage and current sensors or (ii) directional coupler sensors. As an example, the voltage and current signals are in phase when the load impedance matches the characteristic impedance of the transmission line 18. Similarly, the signals representative of the forward and reverse power are in phase when load impedance matches the characteristic impedance of the transmission line 18.

Based on the complex reflection coefficient Γ, which is a ratio of the reverse power $P_{REV}$ to the forward power $P_{FWD}$, a phase difference between the reverse power $P_{REV}$ and the forward power $P_{FWD}$ is minimized and/or reduced to 0. When voltage and current sensors are used, a phase difference between the voltage and phase signals is also minimized and/or reduced to 0. This leads to a control law represented by equation 15, wherein $\cos(\Theta)_d$ is a desired or predetermined value and $\cos(\Theta)_a$ is an actual and/or calculated value.

$$\cos(\Theta)_d - \cos(\Theta)_a = 1 - \cos(\Theta)_a \quad (15)$$

Minimizing the phase difference between the sensor signals minimizes and/or reduces the distortion to 0.

In a directional coupler sensor implementation, it is feasible for an offset to occur in a primary conductance circle from an admittance grid of a Smith chart. The primary conductance circle refers to a circle that passes through an origin in a complex reflection coefficient grid of the Smith chart. Portions of the primary conductance circle are shown in FIGS. 5A, 6A, 7A and 8A. The load of the matching network 14 is set such that the tune input 54 when adjusted causes the reflection coefficient Γ as mapped to a unit circle of the Smith chart to follow a conductance circle and pass through the origin. At the origin, the impedance of the matching network 14 matches the characteristic impedance of the transmission line 18.

As another example, the frequency of the power amplifier 20 may be servo controlled to adjust the impedance and/or reflection coefficient Γ to an intersection of a real axis of the Smith chart in a complex plane of the reflection coefficient Γ. Frequency adjustment of the power amplifier 20 is described below with respect to FIGS. 2 and 4. For a directional coupler sensor implementation, the phase difference is adjusted to ±π. Taking advantage of the symmetrical nature of the cosine function, the control law is revised and may be represented by equation 16.

$$\cos(\Theta)_d - \cos(\Theta)_a = 1 - |\cos(\Theta)_a| \quad (16)$$

For a voltage and current sensor implementation, the primary conductance circle may not intersect the origin and exhibit a rotational offset due to systematic variation in the RF power system 10 and the load to be matched. The cosine function may be reduced to a non-zero value producing a small error in $\cos(\Theta)_d - \cos(\Theta)_a$. This is one of several benefits in contrast to measuring the phase directly.

For an expedient search to a maximum power transfer state, the feedforward control follows a trajectory along the conductance circle to minimize the distance to the origin and to assure that the origin is reached. Since the feedforward control includes using vector calculus to measure the cosine function including determining a ratio of magnitudes of X and Y, a quantitative measure of directivity is provided. The ratio of magnitudes provides a quantitative measure for directivity. Directivity may refer to a tuning direction, a direction in which a correction value is adjusted, whether distortion is increased or decreased, etc.

The use of the sine function instead of the cosine function can also provide directivity. The cosine function does not provide implied directivity, whereas the sine function does, as the output of the sine function may be compared to 0 and the output of the cosine function may be compared to 1. Equation 13 may be modified as follows to provide directivity. Both sides of equation 4 may be squared to provide $\cos^2(\Theta)$. The square of the cosine function $\cos^2(\Theta)$ is equal to 1 minus the square of the sine function $(1-\sin^2(\Theta))$. The control law provided by equation 16 may then be modified as shown by equation 17.

$$\cos(\Theta)_d - \cos(\Theta)_a = 1 - |\sin^2(\Theta)_a| \quad (17)$$

When directional coupler sensors are used, impedance of the matching network 14 and/or frequency of the power amplifier 20 may be adjusted such that the ratio of magnitudes is reduced to a minimum value. Reducing the ratio of magnitudes indicates that the impedance and/or frequency adjustments are tending to a maximum power transfer along a shortest path. As an alternative to and/or in addition to determining the ratio of the magnitudes, a magnitude of the reverse power $P_{REV}$ may be monitored and minimized. When voltage and current sensors are used, the impedance and/or frequency adjustments are performed such that the ratio of the magnitudes tends to the characteristic impedance of the transmission line 18.

As described herein, techniques are provided to correct a power mismatch using servo tunable elements based on a ratio of magnitudes of RF sensor outputs and a sinusoidal calculation based on the RF sensor outputs. Although the update rate is faster in a digital sampling system than for mechanically tunable circuit elements, analog components may be used for a frequency tunable power source.

Instead of or in addition to adjusting the tune and load inputs 54, 56, frequency of the power amplifier 20 may be adjusted within a predetermined frequency range. Agile frequency control may be provided using feedforward control complementing feedback power control. If the load impedance of the RF generator 12 varies, the power control module 32 may not be able to correct for this change and/or may be limited in correcting for this change. By determining the sinusoidal function, an estimate of the distortion imposed by an impedance disturbance is determined. To further correct for the change in load, the frequency drive of the power amplifier and/or the frequency of the RF power signal may be adjusted based on the sinusoidal function to further counter the reactive distortion to the load. This is described in further detail below with respect to FIGS. 2 and 4.

In FIG. 2, a RF power system 100 is shown. The RF power system 100 includes a RF generator 102, the matching network 14 with the impedance matching circuit 50 and the second sensors 90, and the load 16. The RF generator 102 generates a RF power signal 104, which is provided to the matching network 14. The RF generator 102 includes a RF power source (or a power amplifier) 106 and the feedback loop 22. The power amplifier 106 generates the RF power signal 104, which is an output to the matching network 14. The power amplifier 106 may generate the RF power signal 104 based on (i) a power signal received from the power source 24 external to the power amplifier 106, and/or (ii) a frequency tuning value $u_{ff}^f$. The power source 24 may be, for example, a direct current (DC) power source.

The feedback loop 22 includes the sensors 26, the scaling module 28, the first summer 30, and the power control module 32. The sensors 26 generate the sensor signals 33, which are received by the scaling module 28. The scaling module 28 scales the sensor signals 33 and generates the power feedback signal 34. The power feedback signal 34 is generated based on the sensor signals 33 and the scaling matrix. The first summer 30 sums the power feedback signal 34 with the predetermined power setpoint signal 36, which may be generated by the power setpoint module 38. The power feedback signal 34 may be subtracted from the predetermined power setpoint signal 36 to generate the error signal $e_{fb}$.

The power control module 32 receives the error signal $e_{fb}$ and generates the power control signal u to regulate power out of the power amplifier 106. The power amplifier 106 adjusts the RF power signal 104 based on the power control signal $u_{fb}^P$ and the frequency tuning value $u_{ff}^f$. The RF power signal 104 may be a pulsed waveform and have a frequency set based on the frequency tuning value $u_{ff}^f$.

The RF generator 12 may further include the first feedforward loop 40, the second feedforward loop 42, and a third feedforward loop 110. The RF power system 10 may include the third feedforward loop 110 and not the first and second feedforward loops 40, 42 or may include the first, second and third feedforward loops 40, 42, 110, as shown. The first feedforward loop 40 includes the first distortion module 44 and the first correction circuit 46 with the first input module 60, the second summer 62 and the tune control module 64. The second feedforward loop 42 may include the second distortion module 70 and the second correction circuit 72 with the load setpoint module 76, the third summer 78 and the load control module 80.

Although the third feedforward loop 110 is drawn as a feedback loop, the third feedforward loop 110 performs as a feedforward loop and performs a feedforward function and is thus referred to herein as a feedforward loop. The third feedforward loop 110 provides the frequency tuning value $u_{ff}^f$, which is used to adjust frequency of the RF power signal 104. By adjusting the frequency of the RF power signal 104, frequency responses of the matching network 14 changes, which alters impedances in the matching network 14. These impedance changes affect impedance matching between the matching network 14 and the transmission line 18, which affects the amount of reverse power $P_{REV}$ and the amount of power transferred $P_d$.

The third feedforward loop 110 includes the first distortion module 44 and a third correction circuit 112. The third correction circuit 112 includes a second input module 114, a fourth summer 116 and a frequency control module 118, which may be represented as a function $D_{ff}^f(z)$. The second input module 114 generates a third predetermined value (e.g., 1). The fourth summer 116 may subtract the distortion tuning value $d_t$ from the third predetermined value to generate a third correction value $c_f$. The frequency control module 118 may include a fourth PID controller and generate the frequency tuning value $u_{ff}^f$ based on the third correction value $c_f$. The frequency control module 118 may adjust the frequency tuning value $u_{ff}^f$ to match the first distortion value $d_t$ to the third predetermined value. The frequency control module 118 may generate and/or receive the third predetermined value.

Figure 3:
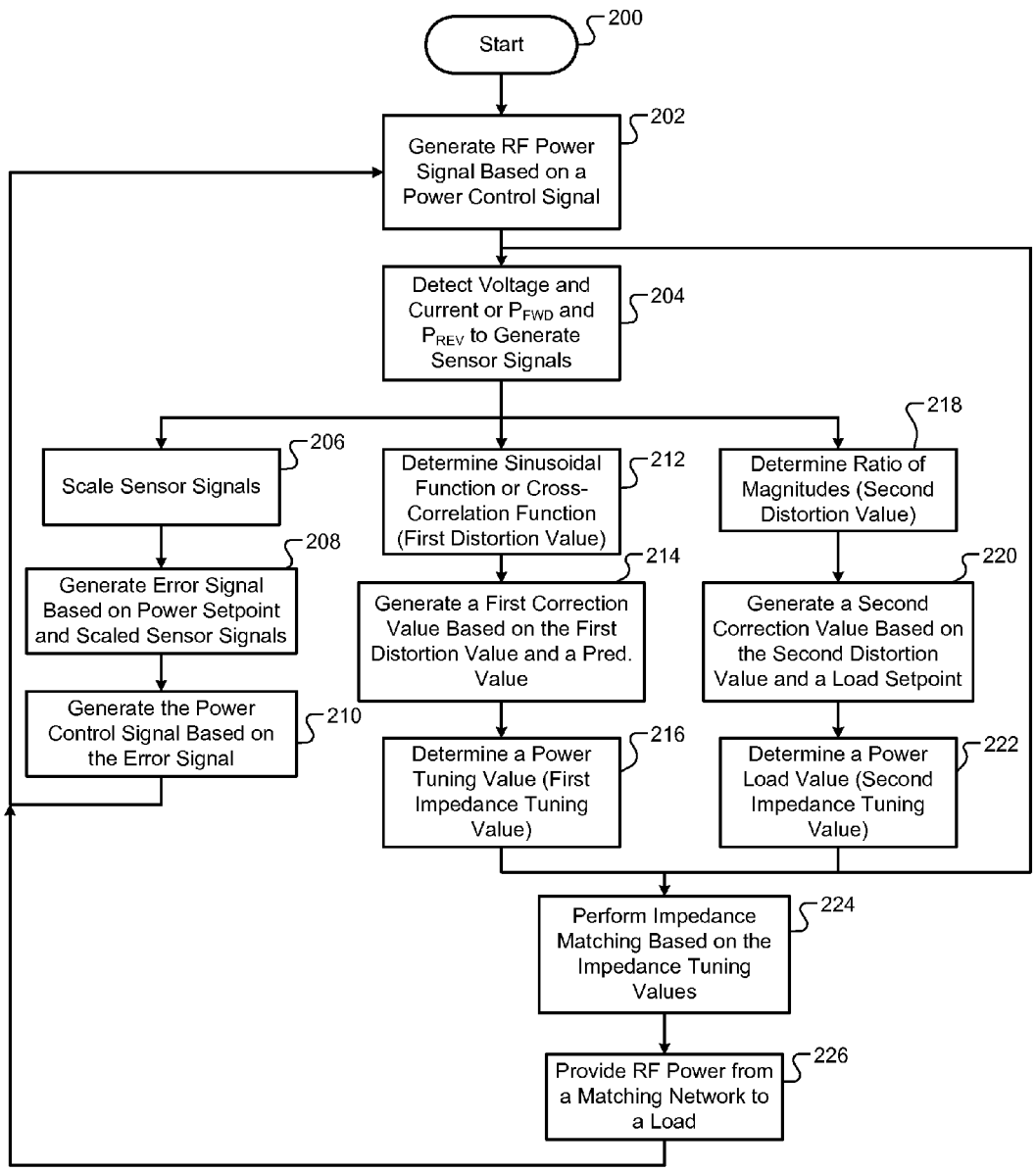
FIG. 3 illustrates a feedforward and feedback control method in accordance with the present disclosure.

The RF power system 10 of FIG. 1 may be operated using numerous methods, an example method is provided by the method of FIG. 3. In FIG. 3, a feedforward and feedback control method is shown. Although the following tasks are primarily described with respect to the implementation of FIG. 1, the tasks may be easily modified to apply to other implementations of the present disclosure. The tasks may be iteratively performed and may be performed as described above. The method may begin at 200.

At 202, the power amplifier 20 generates the RF power signal 17 based on the power control signal $u_{fb}^P$. At 204, the sensors 26 detect voltage V, current I, reverse power $P_{REV}$, and/or forward power $P_{FWD}$ and generate the corresponding sensor signals 33.

At 206, the scaling module 28 scales and/or filters the sensor signals 33 to generate the power feedback signal 34. The scaling and/or filtering may include a moving average. The scaling module 28 may include a two term finite impulse response (FIR) filter. The scaling module 28 may apply heterodyne filtering, as described herein. At 208, the first summer sums the power setpoint signal 36 with the power feedback signal 34 to generate the error signal $e_{fb}$.

Calibration

Referring again to FIGS. 1 and 2, irrespective of sensor type, signals generated by the sensors 26 may be phase corrected via the scaling module 28. Systematic error between signals X and Y may be determined using trigonometric functions or equations 18 and 19, where Θ is the phase difference between signals X and Y.

$$\sin(\Theta+\xi)=\sin\Theta\cos\xi+\cos\Theta\sin\xi \quad (18)$$

$$\cos(\Theta+\xi)=\cos\Theta\cos\xi+\sin\Theta\sin\xi \quad (19)$$

The systematic error ξ is determined based on a least square approximation of multiple impedances with known phase angles. The sin(Θ) and cos(Θ) quantities are measurement distortion quantities, which are each used in the calibration.

Filtering

When performing heterodyne filtering, the scaling module 28 may use a digital heterodyne method, which is an analog implementation that extracts a frequency of interest from a multiple frequency spectrum (referred to as a sinusoidal function extraction). This may include the sinusoidal function extraction, which is different than using a vector calculus technique. The frequency of interest is the frequency of the RF source or generator (e.g., one of the RF generators 12 or 102).

First, the distinction of the vector calculus based method and the sinusoidal function method. In a digital scheme, the vector calculus method of determining sin(Θ) and cos(Θ) includes acquiring a block of samples to perform corresponding calculations, followed by performing a calibration (e.g., the calibration described above). The vector calculus method may be used for wideband sampling when the frequency spectrum is not corrupted by other frequencies. In the case when the wideband spectrum contains the frequency of interest and other frequencies that will impair the distortion measurement (e.g., sin(Θ) and cos(Θ)), a heterodyne method may be used.

A resulting output signal or signal representing a frequency of interest, generated when using a heterodyne method, may be sampled. The samples may be used to compute the distortion using the vector calculus method. When the heterodyne method produces quadrature signals (a signal represented in complex form—real component (I) and imaginary component (Q)), the distortion is measured more directly.

In general form, a first quadrature sensor signal x[n] may be expressed as $x[n]=|X|e^{j(\omega nT+\Theta_x)}$ is representative of the frequency of interest from one of the sensor signals generated by one of the sensors 26. Similarly, a second quadrature sensor signal y[n] may be expressed as $y[n]=|Y|e^{j(\omega nT+\Theta_y)}$. Mathematically, these complex expressions have an alternate form, $x[n]=x_r[n]+jx_i[n]$, where the real quantity is defined as $x_r[n]=|X|\cos(\omega nT+\Theta_x)$, and the imaginary quantity is defined as $x_i[n]=|X|\sin(\omega nT+\Theta_x)$. The distortion determination (distortion method) described above is quantified by the sinusoidal functions, where the phase Θ is the phase difference between $\Theta_x$ and $\Theta_y$. From this complex representation of the frequency of interest and from the corresponding sensor signal, the distortion can be determined directly from a single sample of the quadrature sensor signals x[n] and y[n]. Below is an example of how to computationally extract this information from the real and imaginary components.

A numerator term is formed from: a product of x[n] and y[n]; a conjugate of y[n]; and $\bar{y}[n]=|Y|e^{-j(\omega nT+\Theta_y)}$ to yield equation 20, where $\Theta=\Theta_x-\Theta_y$.

$$x[n]\cdot\bar{y}[n]=|X|e^{j(\omega nT+\Theta_x)}|Y|e^{-j(\omega nT+\Theta_y)}=|X||Y|e^{j(\Theta_x-\Theta_y)}=|X||Y|(\cos\Theta+j\sin\Theta) \quad (20)$$

The numerator term is normalized by a denominator term |X||Y|. A ratio of the numerator term and the denominator term yields a sinusoidal function, cos Θ+j sin Θ. As described above, the x[n] and y[n] terms may represent output signals from a sensor. For example, x[n] may represent a voltage port and y[n] may represent a current port of a V/I sensor. The calibration method may then be applied to the real (cos Θ) and imaginary (sin Θ) terms. Example output results shown in FIGS. 9A-9D are provided using the digital heterodyne filtering method and a sinusoidal function as described above.

There is no inherent speed difference for frequency tuning between the vector calculus method and the heterodyne filtering method. The accumulation of samples to perform the vector calculus version of quantifying the distortion takes approximately the same amount of time as the heterodyne filtering method with quadrature output signal.

At 210, the power control module 32 generates the power control signal $u_{fb}^P$ based on the error signal $e_{fb}$. At 212, the first distortion module 44 determines the first distortion value $d_t$ according to the sinusoidal function or cross-correlation function. The first distortion value $d_t$ is a measurable quantity of a reactive disturbance or distortion. At 214, the second summer 62 generates the first (or tune) correction value $c_t$ based on the first distortion value $d_t$ and the first predetermined value. At 216, the tune control module 64 generates the power tuning value (or first impedance tuning value) $u_{ff}^t$ based on the first correction value $c_t$.

At 218, the second distortion module 70 determines the ratio of magnitudes to generate the second distortion value $d_l$. At 220, the third summer 78 generates the second (or load) correction value $c_l$ based on the second distortion value $d_l$ and the load setpoint value. At 222, the load control module 80 generates the power load value (or second impedance tuning value) $u_{ff}^l$ based on the second correction value $c_l$.

At 224, the matching network 14 performs impedance matching based on the first and second impedance tuning values $u_{ff}^t$, $u_{ff}^l$. At 226, RF power is provided from the matching network 14 to the load 16. Task 202 may be performed subsequent to task 226.

The RF power system 100 of FIG. 2 may be operated using numerous methods, an example method is provided by the method of FIG. 4. In FIG. 4, a feedforward and feedback control method is shown with frequency-based impedance matching feedforward control. Although the following tasks are primarily described with respect to the implementation of FIG. 2, the tasks may be easily modified to apply to other implementations of the present disclosure. The tasks may be iteratively performed. The method may begin at 250.

At 252, the power amplifier 106 generates the RF power signal 104 based on the power control signal $u_{fb}^P$. At 254, the sensors 26 detect voltage V, current I, reverse power $P_{REV}$, and/or forward power $P_{FWD}$ and generate the corresponding sensor signals 33.

At 256, the scaling module 28 scales the sensor signals 33 to generate the power feedback signal 34. At 258, the first summer sums the power setpoint signal 36 with the power feedback signal 34 to generate the error signal $e_{fb}$. At 260, the power control module 32 generates the power control signal $u_{fb}^P$ based on the error signal $e_{fb}$.

At 262, the first distortion module 44 determines the first distortion value $d_t$ according to the sinusoidal function or cross-correlation function. At 264, the second summer 62 generates the first correction value $c_t$ based on the first distortion value $d_t$ and the first predetermined value. At 266, the tune control module 64 generates the power tuning value (or first impedance tuning value) $u_{ff}^t$ based on the first correction value $c_t$.

At 268, the second distortion module 70 determines the ratio of magnitudes to generate the second distortion value $d_l$. At 270, the third summer 78 generates the second correction value $c_l$ based on the second distortion value $d_l$ and the second predetermined value. At 272, the load control module 80 generates the power load value (or second impedance tuning value) $u_{ff}^l$ based on the second correction value $c_l$.

At 274, the fourth summer 116 generates the third (or frequency) correction value $c_f$ based on the first distortion value $d_t$ and the second predetermined value. The frequency correction value $c_f$ (e.g., a value not equal to 0) on which the frequency f of the RF power signal 104 is determined may be based on the sinusoidal function used. Significance of the distortion is defined as the frequency f divided by a change in the sinusoidal function due to the change in impedance of the load on the RF generator 102. This can be quantified by comparing this significance of distortion to a frequency when the disturbance is not present (i.e. when the frequency correction value $c_f$ is equal to 0).

At 276, the frequency control module 118 generates the power frequency value (or third impedance tuning value) $u_{ff}^f$ (or the degree of the correction) based on the third correction value $c_f$. For a given conductance circle and measured disturbance to the reactance of a load, the sinusoidal (or cosine) function may be mapped with a gain $G_f$ to a one step correction of the distortion, where the frequency tuning value $u_{ff}^f$ is equal to the frequency correction value $c_f$ multiplied by the gain $G_f$, as shown by equation 15.

$$u_{ff}^f = c_f G_f \quad (15)$$

The frequency control module 118 may provide a high order response with frequency correction to offset the distortion and maximize power transfer. The higher order response may be an alternative to a one step correction approach. A PID controller may be used to provide the higher order response (dynamic response).

The frequency control module 118 may implement two approaches the one step correction approach and the approach in which the dynamic response of the frequency control module 118 is controlled. Frequency tuning may be defined for operation over a finite bandwidth, for example, ±5% of a center frequency of the RF power supply (e.g., one of the RF generators 12 or 102). The frequency control module 118 updates frequency to accelerate through an operating bandwidth and converge on a frequency tune point that maximizes power transfer. The operating bandwidth is scaled as a function of the center frequency. As a result, a frequency response of the frequency control module 118 scales with frequency. This allows auto-configuring of the response of the frequency control module 118 as prescribed by the bandwidth. An example bandwidth is 1.356 MHz, from which results shown in FIGS. 9A-9D are provided.

Frequency updates performed by the frequency control module 118 may be performed using a PID controller with PID coefficients (or terms) that are based on the operating bandwidth. The PID coefficients are set such that there is a minimal amount of overshoot past a predetermined frequency and/or distortion value. Based on the distortion measurement, the frequency control module 118 accelerates through the operating frequency band quickly without considerable overshoot. This minimizes the amount of settling time. For a frequency of, for example, 60 MHz, the bandwidth may be 6 MHz. The PID coefficients are scaled such that the same tune-time performance is gained. The PID coefficients for, for example, 13.56 MHz provide a maximum frequency hop of 165 KHz. For 60 MHz, this scales by about 5, or 0.825 MHz as a maximum hop. This provides a handsoff servo-automatic frequency tuning configuration.

At 278, the matching network 14 performs impedance matching based on the first, second and third impedance tuning values $u_{ff}^t$, $u_{ff}^l$, $u_{ff}^f$. At 280, RF power is provided from the matching network 14 to the load 16. Task 252 may be performed subsequent to task 280.

The above-described tasks of FIGS. 3 and 4 are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

Figure 5A:
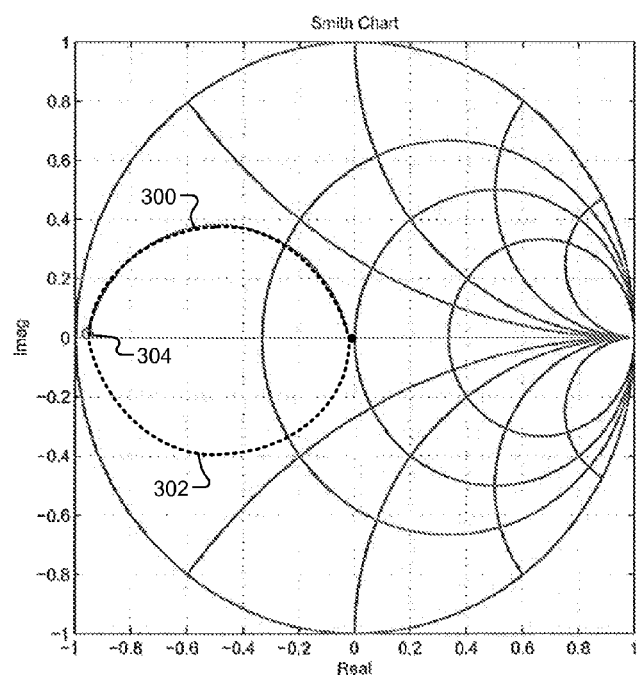
FIG. 5A is a Smith chart illustrating a frequency tuning trace of a reflection coefficient when voltage and current sensors are used while initializing at a low end of a frequency range in accordance with the present disclosure.
Figure 5B:
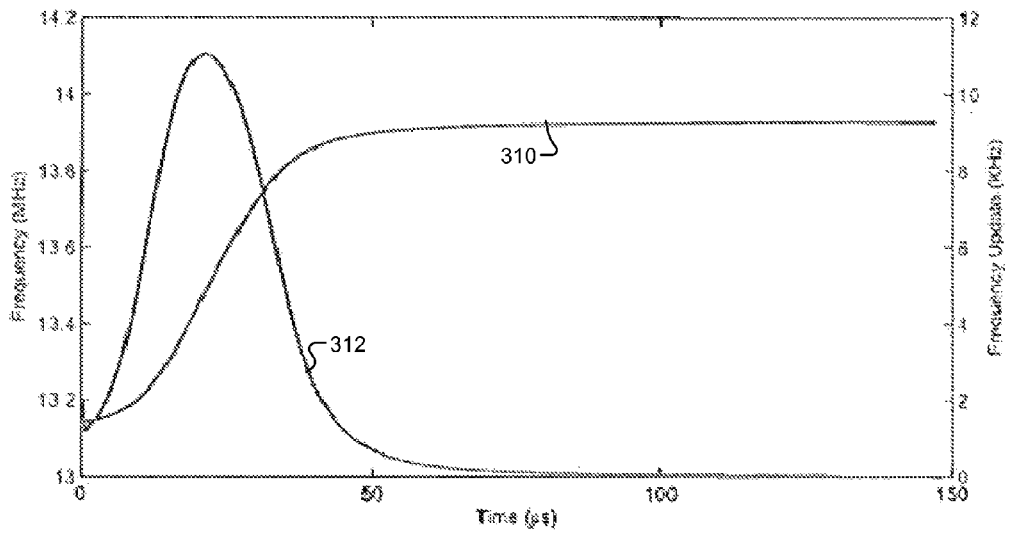
FIG. 5B is a plot illustrating frequency updating associated with the frequency tuning trace illustrated in FIG. 5A.
Figure 5C:
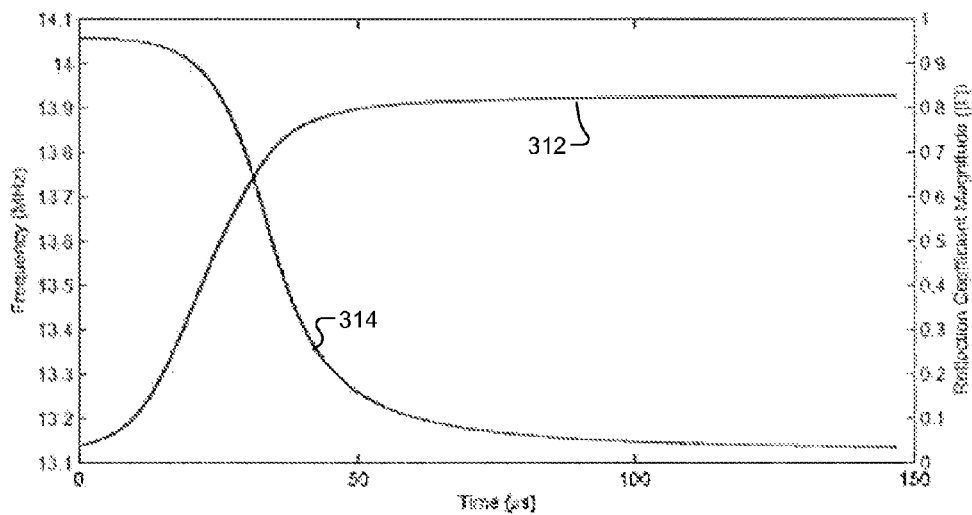
FIG. 5C is a plot illustrating a change in magnitude of the reflection coefficient corresponding to the frequency updating of FIG. 5B.
Figure 6A:
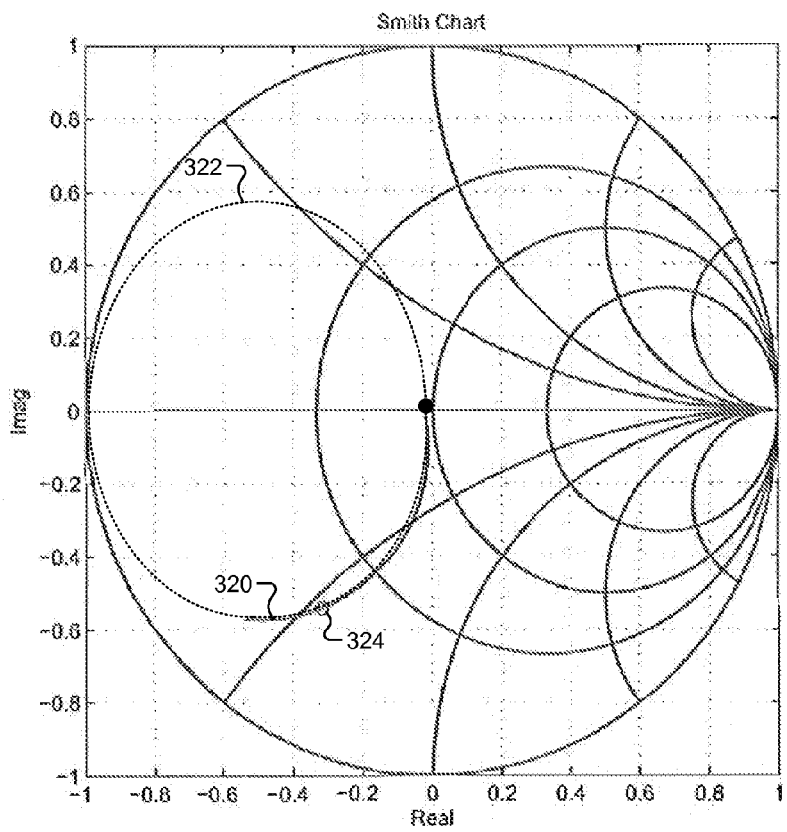
FIG. 6A is a Smith chart illustrating a frequency tuning trace of a reflection coefficient when voltage and current sensors are used while initializing at a high end of a frequency range in accordance with the present disclosure.
Figure 6B:
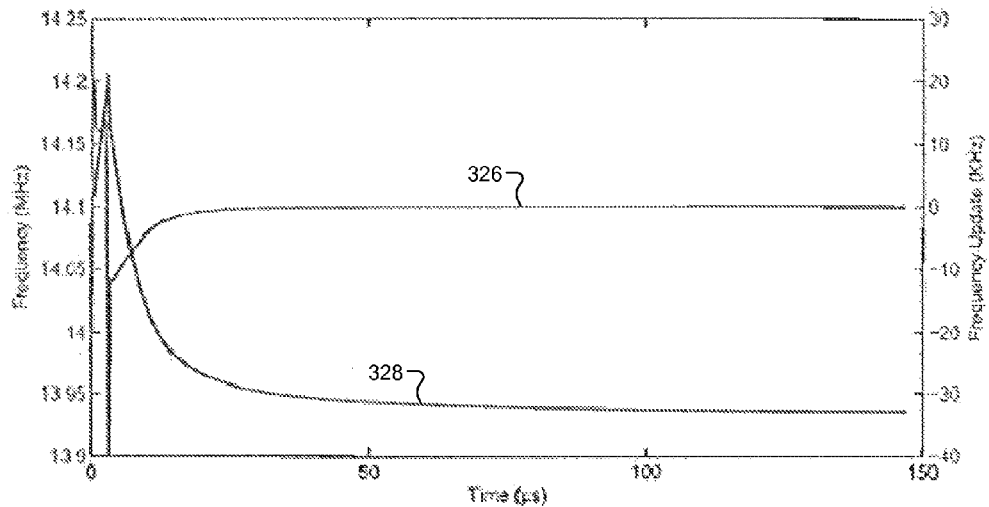
FIG. 6B is a plot illustrating frequency updating associated with the frequency tuning trace of FIG. 6A.
Figure 6C:
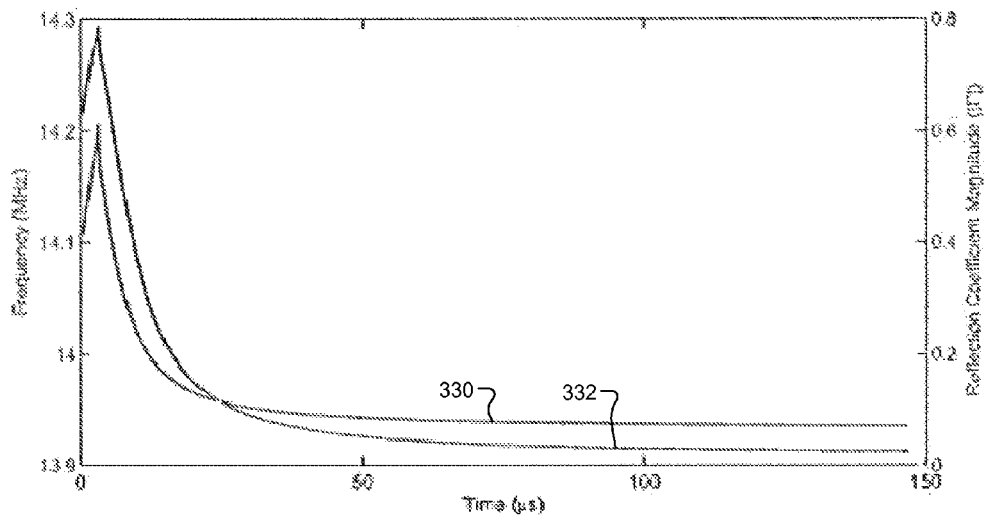
FIG. 6C is a plot illustrating a change in magnitude of the reflection coefficient corresponding to the frequency updating of FIG. 6B.

In the following FIGS. 5A-6C, example results are shown for voltage and current sensor implementations where the sinusoidal function is used to servo the frequency in a feedforward scheme. FIGS. 5A-5C illustrate sample results when frequency adjustment is started at a low end of a predetermined frequency operating range of the power amplifier. FIGS. 6A-6C illustrate sample results when frequency adjustment is started at a high end of the predetermined frequency operating range of the power amplifier.

In FIG. 5A, a Smith chart is shown illustrating a frequency tuning trace 300 of a reflection coefficient Γ when voltage and current sensors are used while initializing at a low end of a frequency range. The frequency is adjusted such that the reflection coefficient Γ as mapped to the Smith chart follows a conductance circle 302. The trajectory of tuning the frequency using a quantified distortion determined based on signals from the voltage and current sensors is shown. Frequency initialization is shown as a circle 304. Tuning is performed such that the reflection coefficient Γ converges at an origin (0,0) of the Smith chart.

In FIG. 5B, a plot illustrating frequency updating associated with the frequency tuning trace 300 illustrated in FIG. 5A is shown. The frequency adjustment is shown on the left y-axis and the frequency update is shown on the right y-axis. Signal 310 is the frequency of the RF power signal. Signal 312 illustrates change in the frequency and/or the frequency tuning value $u_{\text{ff}}^f$.

In FIG. 5C, a plot illustrating a change in magnitude of the reflection coefficient Γ corresponding to the frequency updating of FIG. 5B. The frequency signal 310 is shown along with a signal 314 illustrating the magnitude of the reflection coefficient Γ. By inspection of these results for the magnitude of the reflection coefficient Γ in FIG. 5C, the frequency control module 118 may tune to the configured load condition in, for example, 60 µs.

In FIG. 6A, a Smith chart is shown illustrating a frequency tuning trace 320 of a reflection coefficient Γ when voltage and current sensors are used while initializing at a high end of a frequency range. The tune time in this example is 50 µs. Adaptation changes are provided to change the direction on a conductance circle 322 to eventual convergence at an origin (0,0). Frequency initialization is shown as a circle 324.

In FIG. 6B, a plot illustrating frequency updating associated with the frequency tuning trace of FIG. 6A is shown. The frequency adjustment is shown on the left y-axis and the frequency update is shown on the right y-axis. Signal 326 is the frequency of the RF power signal. Signal 328 illustrates change in the frequency and/or the frequency tuning value $u_{\text{ff}}^f$.

In FIG. 6C, a plot illustrating a change in magnitude of the reflection coefficient corresponding to the frequency updating of FIG. 6B is shown. The frequency signal 330 is shown along with a signal 332 illustrating the magnitude of the reflection coefficient Γ. By inspection of these results for the magnitude of the reflection coefficient Γ in FIG. 6C, the frequency control module 118 may tune to the configured load condition in, for example, 50 µs.

Figure 7A:
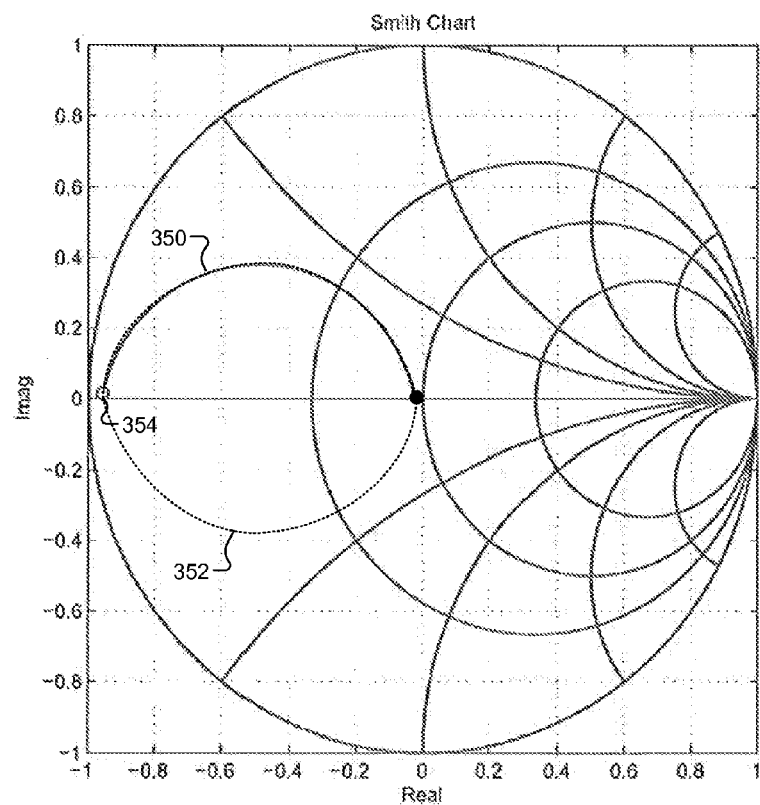
FIG. 7A is a Smith chart illustrating a frequency tuning trace of a reflection coefficient when directional coupling sensors are used while initializing at a low end of a frequency range in accordance with the present disclosure.
Figure 7B:
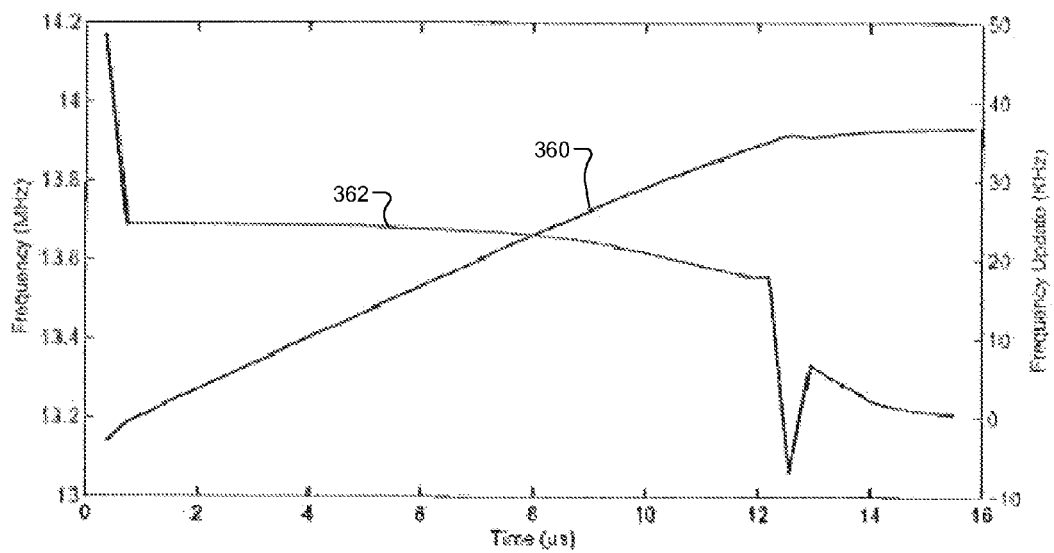
FIG. 7B is a plot illustrating frequency updating associated with the frequency tuning trace of FIG. 7A.
Figure 7C:
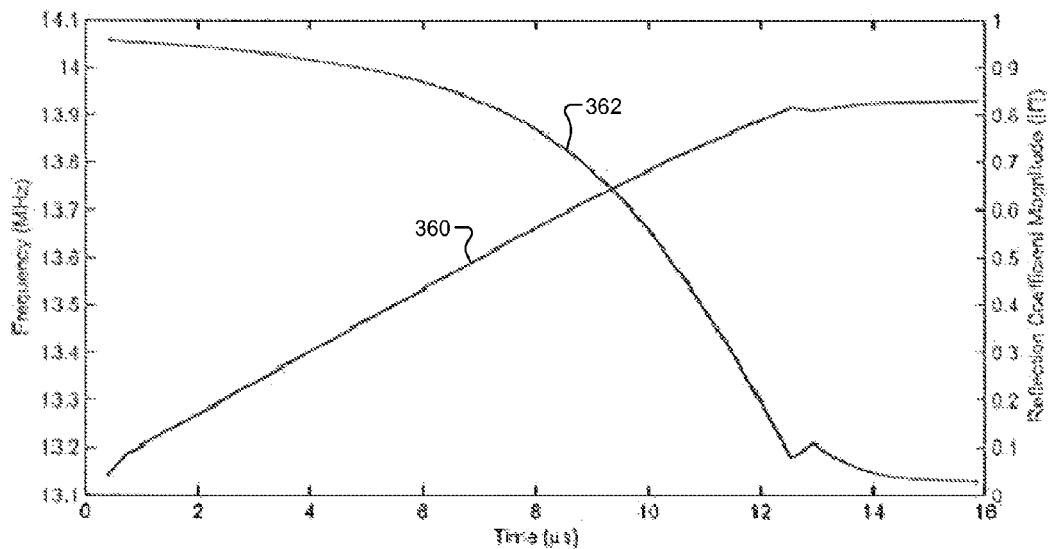
FIG. 7C is a plot illustrating a change in magnitude of the reflection coefficient corresponding to the frequency updating of FIG. 7B.
Figure 8A:
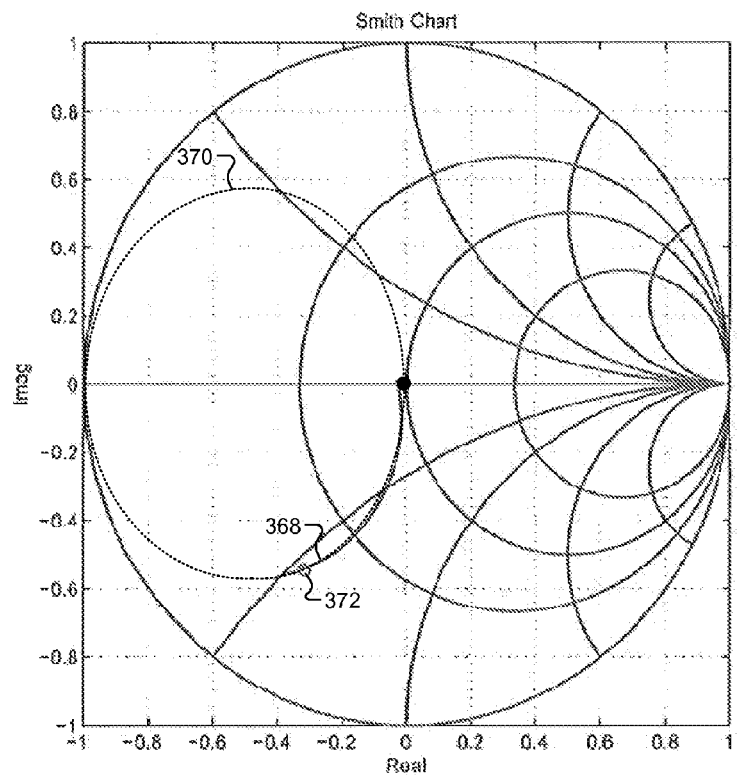
FIG. 8A is a Smith chart illustrating a frequency tuning trace of a reflection coefficient in a matching network when directional coupling sensors are used while initializing at a low end of a frequency range in accordance with the present disclosure.
Figure 8B:
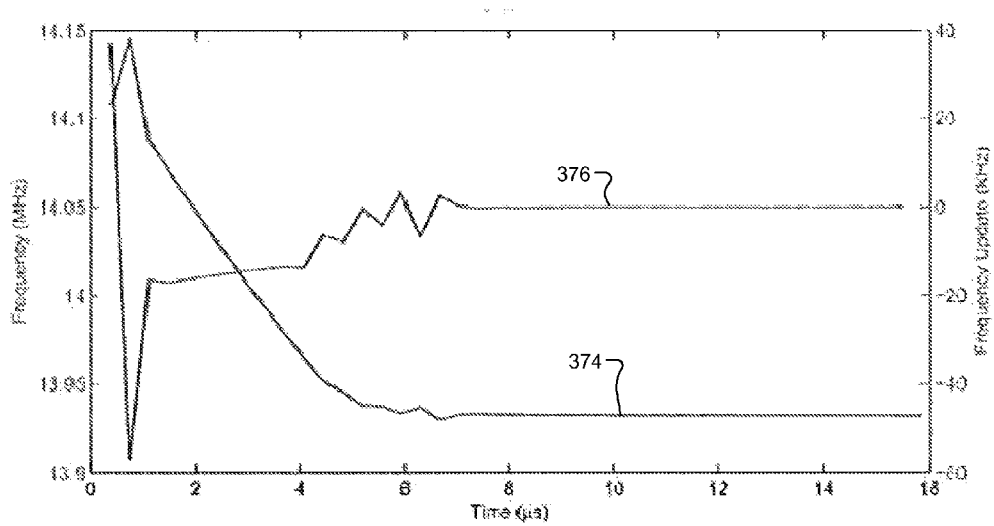
FIG. 8B is a plot illustrating frequency updating associated with the frequency tuning trace of FIG. 8A.
Figure 8C:
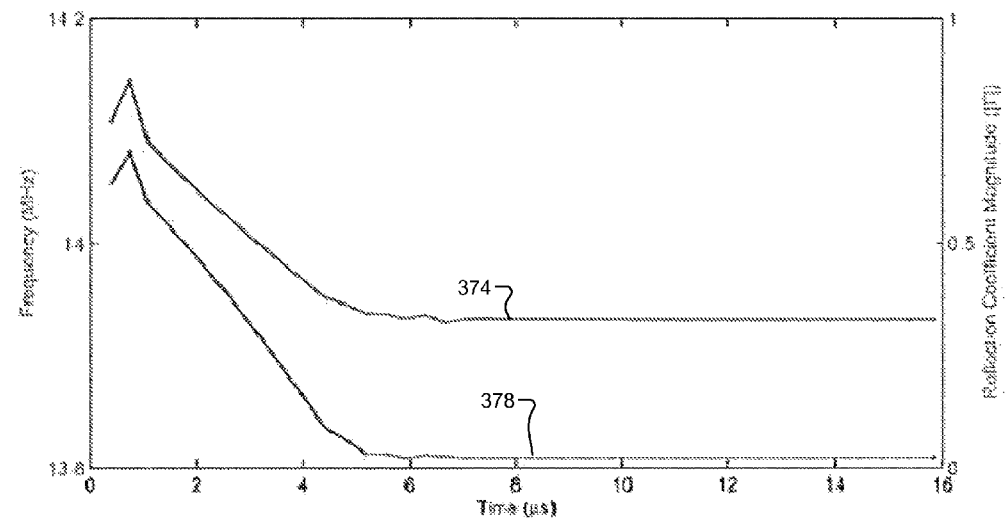
FIG. 8C is a plot illustrating a change in magnitude of the reflection coefficient corresponding to the frequency updating of FIG. 8B.

In the following FIGS. 7A-8C, sample results are illustrated for a directional coupler sensor implementation, where the sinusoidal function associated with the reflection coefficient is used to tune the frequency of the power amplifier. FIGS. 7A-7C illustrate sample results when frequency adjustment is started at a low end of a predetermined frequency operating range of the power amplifier. FIGS. 8A-8C illustrate sample results when frequency adjustment is started at a high end of the predetermined frequency operating range of the power amplifier.

Phase information derived from the directional coupler was accomplished by assigning X to the forward power signal and Y to the reverse power signal. In this case, distortion is quantified by the cosine function of the complex reflection coefficient quantity. The update rate and parameters of the controllers remain the same as the previous simulations. The results from initializing the controller to the lower end frequency range are shown in FIGS. 7A-C and the results with the upper frequency end initialization are shown in FIGS. 8A-C. Automatic frequency tuning occurs in less than 15 us for both frequency initialization conditions.

Though the simulation results indicate the directional coupler corrects the power impairment faster than the VI sensor, this is a function of the controller parameters. The controller's parameters were selected with intent of demonstrating the scheme and not optimized for particular performance. The feedforward controller for the VI sensor can be significantly improved with a better set of parameters.

In FIG. 7A, a Smith chart illustrating a frequency tuning trace 350 of a reflection coefficient Γ when directional coupling sensors are used while initializing at a low end of a frequency range is shown. The frequency is adjusted such that the reflection coefficient Γ as mapped to the Smith chart follows a conductance circle 352. The trajectory of tuning the frequency using a quantified distortion determined based on signals from the directional coupling sensors is shown. Frequency initialization is shown as a circle 354. Tuning is performed such that the reflection coefficient Γ converges at an origin (0,0) of the Smith chart.

In FIG. 7B, a plot illustrating frequency updating associated with the frequency tuning trace 350 of FIG. 7A is shown. The frequency adjustment is shown on the left y-axis and the frequency update is shown on the right y-axis. Signal 360 is the frequency of the RF power signal. Signal 362 illustrates change in the frequency and/or the frequency tuning value $u_{\text{ff}}^f$.

In FIG. 7C, a plot illustrating a change in magnitude of the reflection coefficient Γ corresponding to the frequency updating of FIG. 7B is shown. The frequency signal 360 is shown along with a signal 362 illustrating the magnitude of the reflection coefficient Γ. By inspection of these results for the magnitude of the reflection coefficient Γ in FIG. 7C, the frequency control module 118 may tune to the configured load condition in, for example, 16 µs.

In FIG. 8A, a Smith chart is shown illustrating a frequency tuning trace 368 of a reflection coefficient in a matching network when directional coupling sensors are used while initializing at a low end of a frequency range. The frequency is adjusted such that the reflection coefficient Γ as mapped to the Smith chart follows a conductance circle 370. The trajectory of tuning the frequency using a quantified distortion determined based on signals from the directional coupling sensors is shown. Frequency initialization is shown as a circle 372. Tuning is performed such that the reflection coefficient Γ converges at an origin (0,0) of the Smith chart.

In FIG. 8B, a plot illustrating frequency updating associated with the frequency tuning trace of FIG. 8A is shown. The frequency adjustment is shown on the left y-axis and the frequency update is shown on the right y-axis. Signal 374 is the frequency of the RF power signal. Signal 376 illustrates change in the frequency and/or the frequency tuning value $u_{\text{ff}}^f$.

In FIG. 8C, a plot illustrating a change in magnitude of the reflection coefficient corresponding to the frequency updating of FIG. 8B is shown. The frequency signal 374 is shown along with a signal 378 illustrating the magnitude of the reflection coefficient Γ. By inspection of these results for the magnitude of the reflection coefficient Γ in FIG. 8C, the frequency control module 118 may tune to the configured load condition in, for example, 8 µs.

Although the above provided simulation results indicate that the implementation using directional coupler sensors provides a quicker update rate then the voltage and current sensor implementation, these update rates are a function of control parameters. The control parameters may be modified such that the voltage and current sensor implementation provides a quicker update rate. Also, although the conductive circles 300, 322, 352, 370 shown in FIGS. 5A, 6A, 7A, and 8A are not perfect circles, they each have a circular path and thus are referred to as circles.

Setpoint Adjustment for Reversal and Untenable Load

Figure 10:
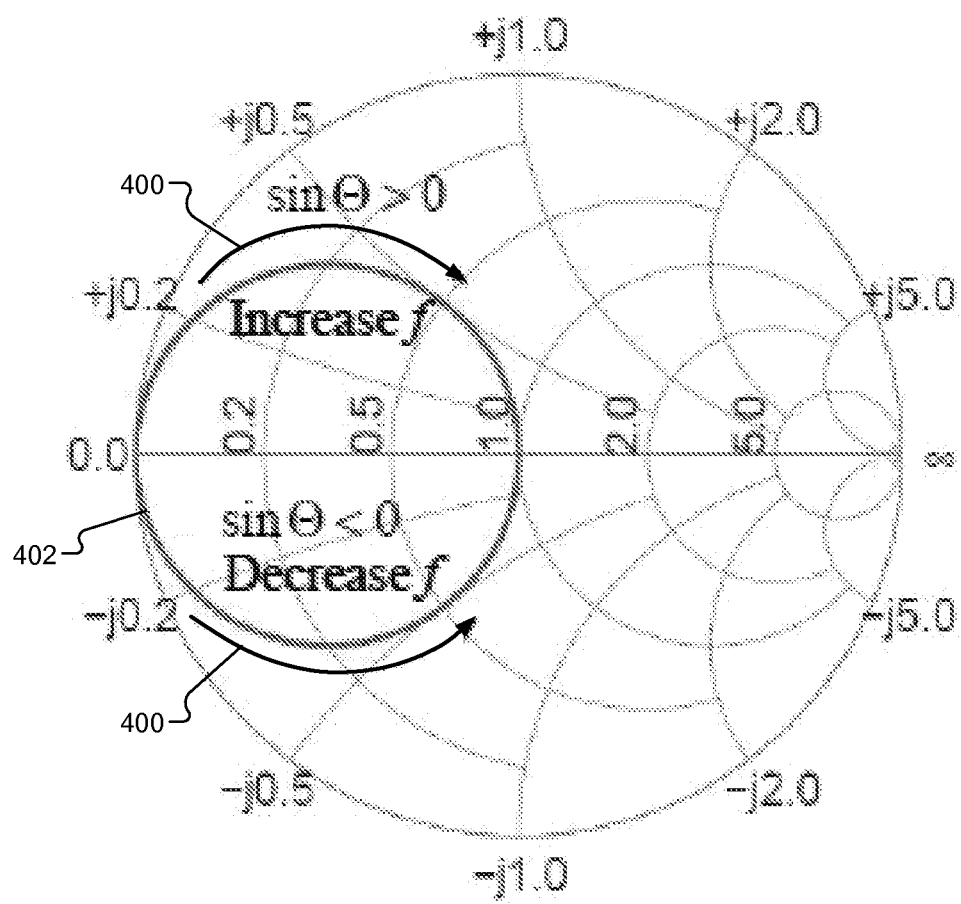
FIG. 10 is a Smith chart illustrating frequency tuning in accordance with the present disclosure.

Referring now to FIGS. 2 and 10, a Smith chart illustrating frequency tuning to a convergence point is shown. The second input module 114 is configured to reverse the frequency update direction and adjust a distortion set point. The second input module 114 indicates the set point of the distortion. The summer 116 computes a difference between the measured distortion and this setpoint to produce the correction term $c_t$. If the measured distortion is cos Θ, then the distortion set point is set equal to 1. If the measured distortion is sin Θ, then the distortion set point is set equal to 0. The distortion set point is used for both reversing the frequency update and for untenable loads.

Reversing the Frequency Update Direction

Figure 11:
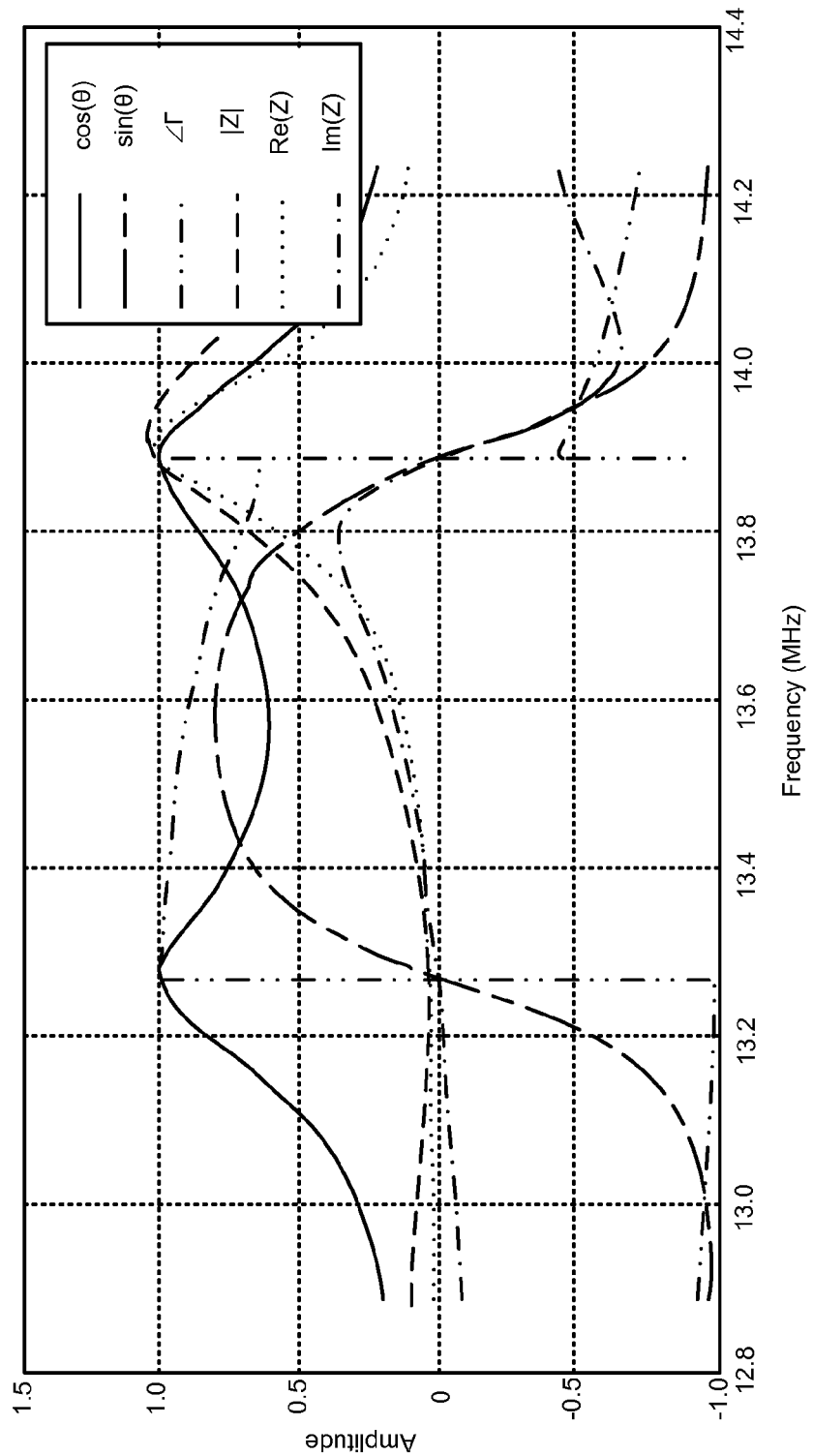
FIG. 11 is a plot illustrating distortion, phase angle, and impedance values in accordance with the present disclosure.

In FIG. 10, frequency tuning is illustrated for a frequency tuning direction illustrated by arrows 400 based on a quantified distortion for an arbitrary conductance circle 402. As an overlay in this figure, the implied directivity of a sine function and a frequency update is indicated with arrows 400. When sin Θ>0, the frequency control module 118 updates a frequency of the power supply (e.g., the RF power systems 10 or 100 of FIGS. 1 and 2) by incrementing the frequency. When sin Θ<0, the frequency control module 118 decrements the frequency of the power supply. In, for example, a frequency range of 13.3-14.2 MHz (shown in FIG. 11) the frequency tuning operation will occur as described. For a distortion value of sin Θ>0, the frequency is increased until sin Θ=0. If the distortion of sin Θ<0, the frequency is decreased until sin Θ=0. For the example show, the frequency where sin Θ=0 is 13.9 MHz. At 13.9 MHz, the distortion is completely corrected and power transfer is maximized.

A range exists where the directivity is reversed. In this range, the second input module 114 adjusts the set point to reverse the directivity. Continuing from the above example, an example range in which directivity is reversed is 12.88-13.3 MHz. When the frequency is 12.88-13.3 MHz, the sin Θ distortion is less than 0 and the frequency is decremented. By decrementing in this frequency range, the frequency moves away from the convergence frequency tuning set point. In this case, the direction is reversed and the distortion will correspondingly decrease until sin Θ=0 at 13.3 MHz. At this frequency, the impedance Z (of the matching network) and reflection coefficient Γ maps to an outer point on the conductance circle 402. While this satisfies a distortion criterion for the sin Θ, the power transfer is not maximized because the normalized impedance |Z| does not yield (or is not equal to) the transmission line impedance. To account for this frequency range, the second input module 114 adjusts the set point such that the frequency direction is reversed and servoing frequency does not yield a non-optimal (or non-predetermined) frequency. Example cos Θ, sin Θ, phase angle of the reflection coefficient ∠Γ, normalized impedance |Z|, and real and imaginary impedance term plots are shown for the frequency range of 13.3-14.2 MHz in FIG. 11.

Untenable Loads

Irrespective of frequency in the operating bandwidth of the RF power supply, an untenable load is defined as a load that is not in the proximity of a center of the Smith chart, where the reflection coefficient approaches zero. In this case, the load to the RF power supply may be arbitrarily represented in the Smith chart with an impedance z that is a function of the frequency f (or z(f)) in the operating bandwidth of the RF power supply. In this scenario, a Θ=0 may not exist. However, under this constraint, the frequency may be served to maximize the power transfer. This is accomplished by adjusting the predetermined set point via the second input module 114 until the sin Θ or the cos Θ meets an updated set point.

The above-described approaches couple servo auto-frequency tuning (AFT) of frequency with power regulation, as opposed to performing these tasks as disparate functions. The servo-AFT approach provides reduced algorithmic complexity relative to traditional directed or guided search methods. A guided search can be defined with course and fine tune modes to control multiple frequency tuning passes. By using the sinusoidal function, a quantitative distortion measure is gained, and from the measured distortion, frequency updates occur until convergence a set point. This allows coalescing of power regulation and frequency tuning for coherent control.

Figure 9A:
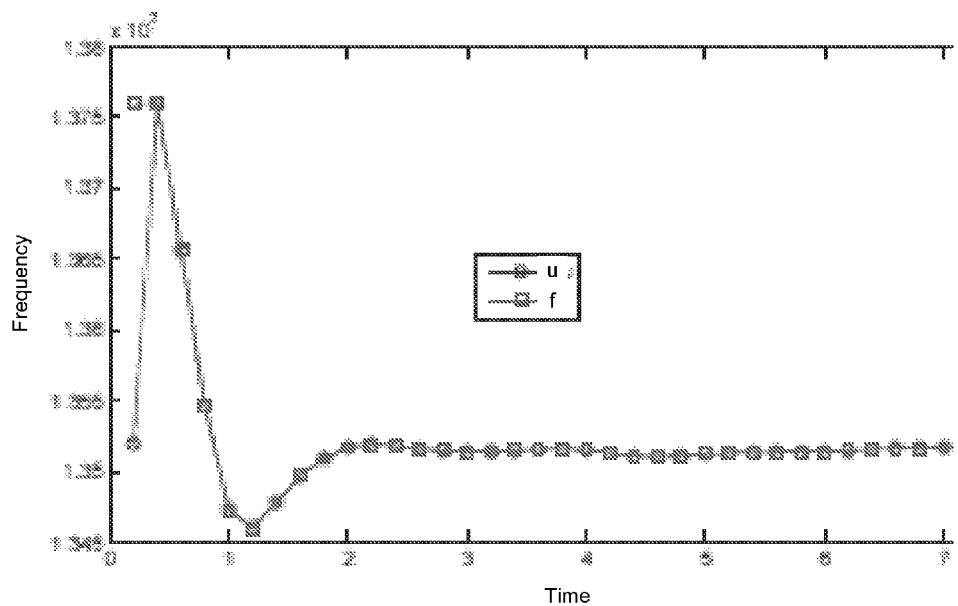
FIG. 9A is a plot illustrating frequency updating and read back in accordance with the present disclosure.
Figure 9B:
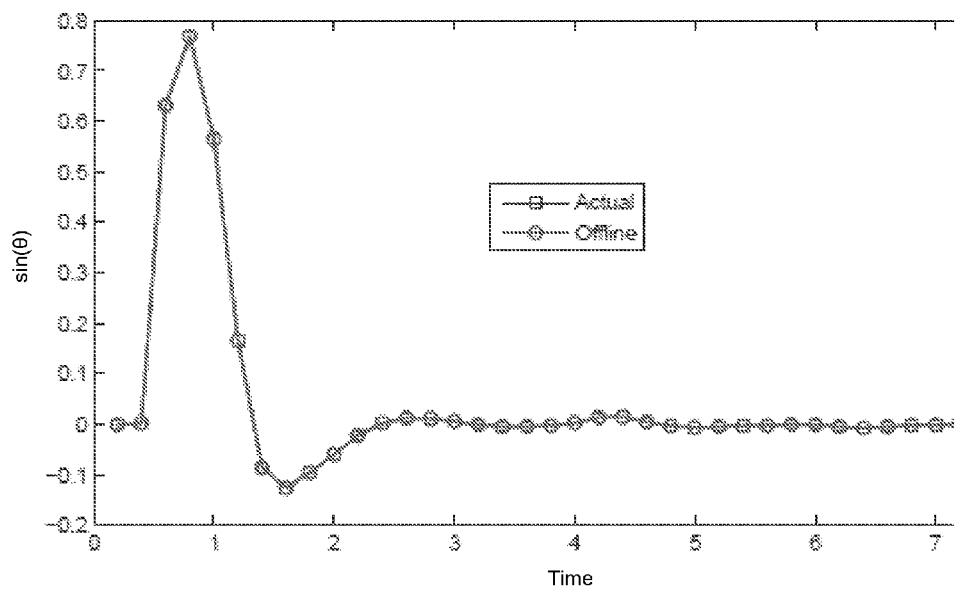
FIG. 9B is a plot illustrating distortion change associated with the frequency updating shown in FIG. 9A.

Referring now to FIGS. 9A-9D, example frequency updating and read back plots are shown along with corresponding distortion change plots. FIGS. 9A and 9B are directed to a first example when the frequency of a RF power supply (e.g., the RF power system 100 of FIG. 2) is adjusted by 220 KHz from a tune frequency of 13.54 MHz. The updated frequency u and a read back frequency f are shown in FIG. 9A. Actual and offline (i.e. theoretical or simulated) distortion values of sin (Θ) are shown in FIG. 9B.

Figure 9C:
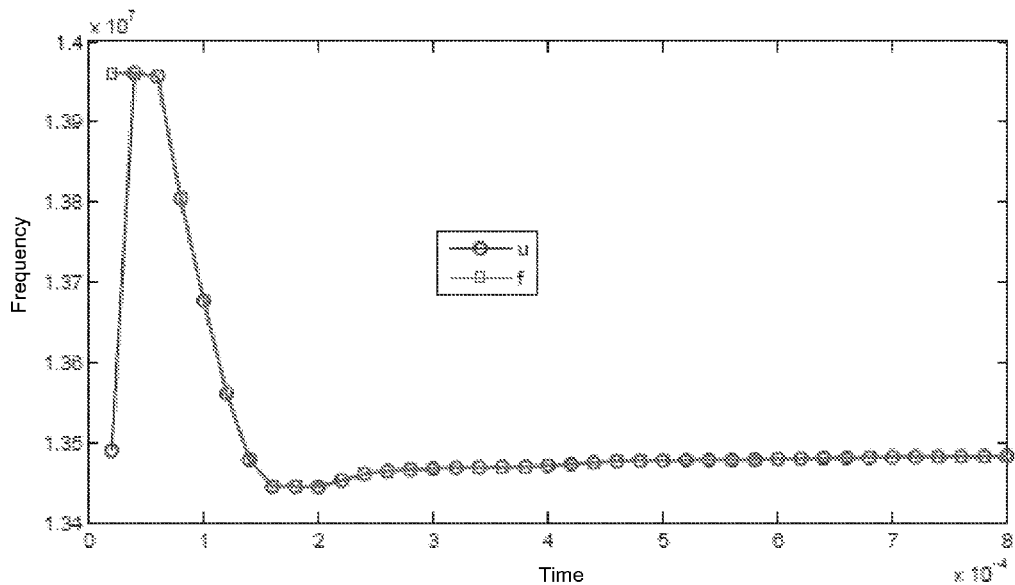
FIG. 9C is another plot illustrating frequency updating and read back in accordance with the present disclosure.
Figure 9D:
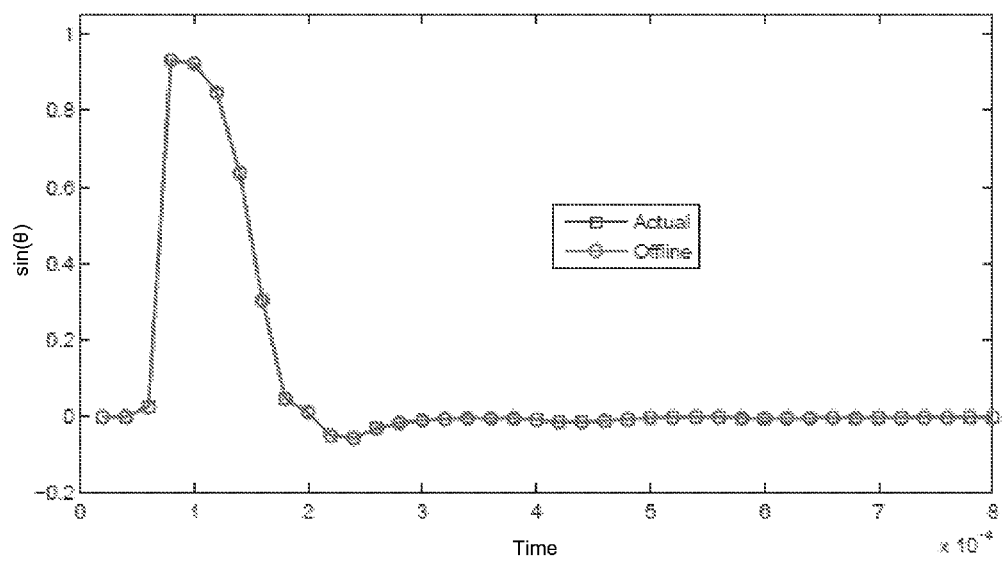
FIG. 9D is a plot illustrating distortion change associated with the frequency updating shown in FIG. 9C.

FIGS. 9C and 9D are directed to a second example when the frequency of a RF power supply (e.g., the RF power system 100 of FIG. 2) is adjusted by 420 KHz from a tune frequency of 13.54 MHz. The updated frequency u and a read back frequency f are shown in FIG. 9C. Actual and offline distortion values of sin(Θ) are shown in FIG. 9D.

The plots in FIGS. 9A-9D illustrate servo-AFT for a plasma system. Servo-AFT is incorporated with power regulation by interleaving a shared interrupt. The interrupt may occur every 10 μs. Power regulation of a power amplifier (e.g., the power amplifier 106 of FIG. 2) is performed during even interrupts via a power control module (e.g., the power control module 32 of FIG. 2). Servo-AFT is processed during odd interrupts. In both examples, the frequency settles to a settling point within 5-6 interrupts. With interleaving the power regulation and servo-AFT interrupts, the tune time is in the range of 100 μs. Due to the use of PID controllers, the tune time duration does not vary between the first example and the second example that required traversing 30% of a tune or operating bandwidth. The offline computation of sin(Θ) is provided to verify accuracy of the actual sin(Θ) values.

In the above-described implementations, servo control techniques are provided using feedforward control to regulate tuning of an agile RF power source to optimize power delivery under dynamic load conditions. The servo control techniques provide quick update rates and tuning to maximized power transfer conditions are achieved in a few microseconds. Quick tuning improves RF power system reliability with less power dissipation in the RF power source (or RF power supply) and less wear to electro-mechanical elements associated therewith. The feedforward control provides a measured (or calculated) result yielding greater control sensitivity with reduced quantitative distortion.

The techniques provide closed form solutions with predictable responses, which are uncharacteristic of heuristic based search methods. The techniques also provide coherent control of RF pulsing waveforms generated by a power amplifier. The techniques are invariant to RF sensor type, as voltage and current sensors and/or directional coupler sensors may be used. Although a digital sampling technique is provided for update rates quicker than mechanically tunable elements, analog techniques are provided. The techniques include a direct measurement of a sinusoidal function using vector calculus in real-time (or as a RF power signal is generated by a power amplifier). Vector equation computations are performed including determining magnitudes of sensor signals to provide tuning directivity, which prevents tuning in an improper direction. The sensor signals are variables of power and are directly related to frequency.

The PID terms, of the PID controllers or of the frequency control module 118, used to adjust the frequency can also be tailored around the design of the power amplifier (e.g., the power amplifier 20) and the overall RF power delivery system (e.g., one of the RF power systems 10 and 100). The components within the RF power supplies (e.g., one of the RF generators 12, 102) or the power delivery system may be limited by df/dt (or an amount of frequency change that can occur over a period of time). The PID terms can be formed to protect the RF power delivery system, components and subsystems of the RF power delivery system, and/or enhance reliability and performance of the RF power delivery system and/or components and sub-systems of the RF power delivery system.

As a result, over a large tune range, the PID terms may be set to limit the scale (amount of change) of the frequency update. This can inadvertently retard performance, because reducing the size of the frequency update requires more frequency updates and extends the frequency tuning time. When tuning frequency to provide an impedance in a local impedance region (i.e. impedance within a predetermined range of an impedance setpoint and/or associated with a distortion setpoint or predetermined distortion range), a different control module (or controller) response is provided. The impedance region may be quantified by the determined distortion (e.g., the sinusoidal function). If the distortion is reduced due to a local impedance point, control module performance is momentarily updated to improve the frequency tune correction time.

In a broader sense, two control module responses, Response A and Response B, may be used. Control module response A is used to limit the scale of the frequency update by appropriately scaling the frequency update. This response is indicative of a distortion exceeding an absolute maximum value. If the distortion is less than the absolute maximum value, control module response B is used for fast convergence. Control module response B provides a convergences rate that is quicker than a convergence rate of control module response A. In one implementation, the PID terms are replaced to provide the control module responses A and B. Selectivity of the control module responses may be based on the distortion detected (or measured).

The above-described techniques may include the use of a single RF sensor, as opposed to the use of two RF sensors used in traditional RF power systems. For example, traditional RF power systems that determine a phase difference between voltage and current output signals typically include two RF sensors to determine the phase of each of the voltage and current output signals. As a phase difference is not determined using the above-described techniques and a single RF sensor may be used to determine voltage and current outputs of a power amplifier, a single RF sensor may be used. Also, as the phase difference is not determined, the challenges associated with calibrating the phase difference are avoided.

The feedforward control provides integrated performance coherent with the feedback control provided by a power control module and with dynamics associated with a load of a RF generator and/or matching network. This is not provided by heuristic methods and other traditional approaches.

One basis of the servo-auto-frequency techniques described above is to correct measured power distortion by updating an agile frequency RF power supply. The above described method(s) may be developed based on a unity conductance circle in a Smith chart. This conveniently traverses the $\sin(\Theta)$ over the $\pm\pi$ range. As a result, the sinusoidal function ranges from $\pm 1$ such that the operating bandwidth frequency limits are assigned respective frequency limits (e.g., +1 for the minimum frequency, and –1 for the maximum frequency).

Figure 12:
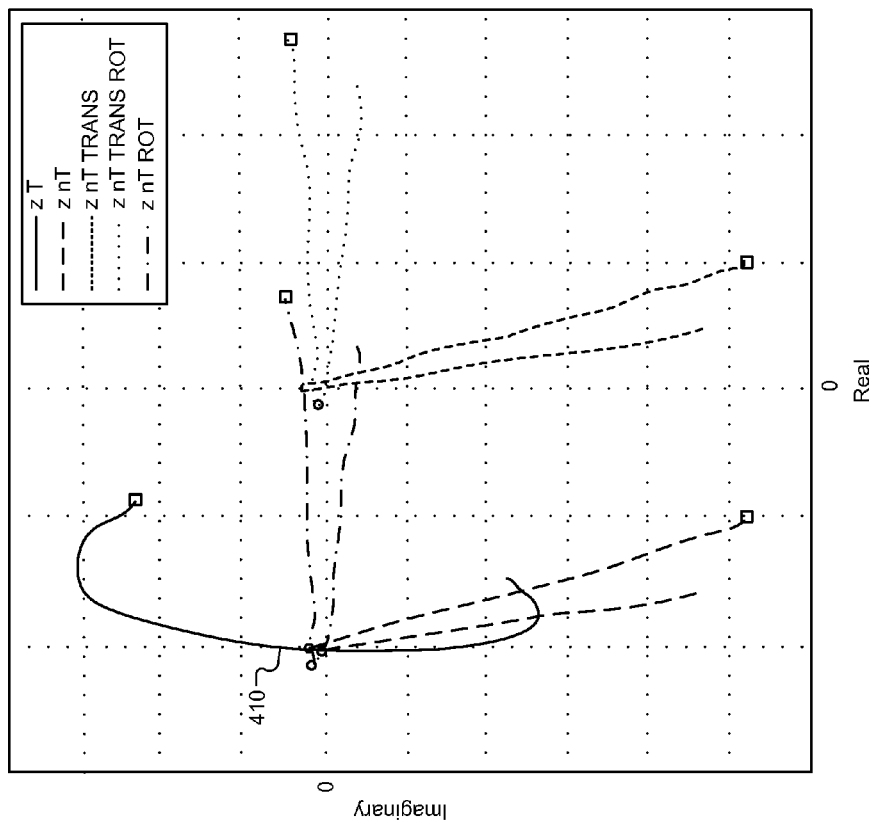
FIG. 12 is a plot illustrating impedance traces in accordance with the present disclosure.

There is an effect related to transmission line theory and its corresponding handling. In transmission line theory, the impedance as seen by the source is effected by the length L of the transmission line. For an arbitrary termination impedance zL, the impedance z at the source will have a phase, for a lossless cable, which will vary as a function of the variation L of the transmission line length (e.g., $z=zLe^{j\beta L}$), where $\beta$ is the ratio of the frequency (rad/s) and the velocity of the wave propagation (m/s). The effect of the transmission line effect on impedance is readily seen in FIG. 12. FIG. 12 shows impedance variation with cable length and with the corresponding correction of the effect. The minimum frequency of the operating bandwidth is associated with the square symbols in the plot. The circle symbols in the plot are associated with the tune frequency that achieves a maximum and/or determined power transfer.

In FIG. 12, trace 410 provides the impedance as a function frequency. As the frequency increases, the trajectory of the imaginary component of the impedance initially increases and then decreases with increasing frequency. At the zero crossing, optimal power transfer occurs where $\sin(\theta=0)=0$, where $\sin(\theta)$ is a quantitative power distortion measurement. The frequency at which $\sin(\theta=0)=0$ occurs, is a tune frequency for achieving a maximum power transfer. This impedance trajectory corresponds to the unity conductance circle of the Smith chart and demonstrates an ideal scenario. When the $\sin(\theta)>0$, frequency is increased. Similarly, when $\sin(\theta)<0$, the frequency is decreased. This provides a systematic method to servo frequency to achieve optimal power transfer by finding the tune frequency when $\sin(\theta=0)=0$ is satisfied.

For non-ideal scenarios, varying the cable length will rotate the impedance through the Smith chart. With the appropriate increase or decrease in cable length, the sinusoidal function $\sin(\theta)$ can become single-sided. For instance, with the appropriate increase in cable length, the sinusoidal function $\sin(\theta)$ may take on values only between 0 and $\pi$. A decrease in cable length by an equal amount causes the function $\sin(\theta)$ to have values only between 0 and $-\pi$. In these instances, the maximum frequency has a similar value as the minimum frequency. The function $\sin(\theta)$ is single-sided in the sense that $\sin(\theta)$ includes values that are either positive or negative. The function $\sin(\theta)$ is not two-sided as in the ideal scenario.

Figure 13:
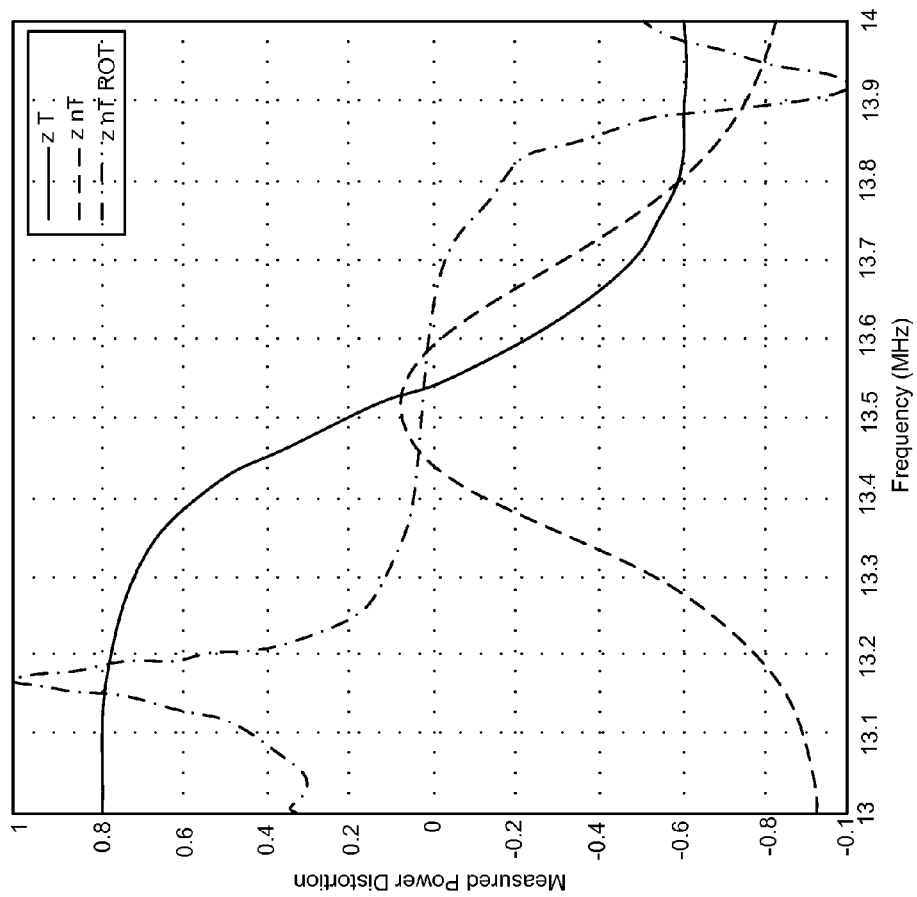
FIG. 13 is a plot illustrating power distortion versus frequency traces for different impedances in accordance with the present disclosure.

The power distortion for the ideal and non-ideal case, as a function of frequency, is shown in FIG. 13. In FIG. 13, a plot of power distortion (y-axis) with respect to frequency is shown for the ideal case (z T) with an impedance trajectory along the unity conductance circle and for the non-ideal case (z nT) with corresponding correction (z nT ROT). The z T traces in FIGS. 12 and 13 correspond to the same impedance for the ideal case for unity conductance and are two-sided.

With increased cable length, the non-ideal case occurs with an impedance trajectory off of the unity conductance circle that corresponds to a single-sided function. This is demonstrated with z nT that primarily has values less than 0 in both FIGS. 12 and 13. In this case, one of the above-described control modules that corrects for power distortion does not have desirable directivity. The sinusoidal function is negative for frequencies that are not the tune frequency where $\sin(\theta=0)=0$. The case can be corrected by changing the cable length, but this has undesirable limitations on implementations using servo frequency control. This can be corrected by an automated procedure executed by the control module to determine an appropriate rotation to apply to the measured impedance for placement on the unit conductance circle.

Referring again to FIG. 12, a phasor rotation may be determined to cancel the cable length impairment that moved the impedance trajectory off of the unit conductance circle and formed the single-sided power distortion function. The non-ideal measured impedance trajectory z nT is moved to the 0,0 coordinates of the complex plane, indicated by the trace z nT TRANS. The function is then rotated by phase angle φ to form znT TRANS ROT in the plot and reverse the translation to create a final result, z nT ROT. This correction forms the two-sided function seen in FIG. 13 by z nT ROT. Mathematically, the correction is described as $z=z_L e^{j\beta L} e^{j\Phi}$.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A radio frequency system comprising:
    a power amplifier that outputs a radio frequency signal to a matching network via a transmission line between the power amplifier and the matching network;
    a sensor monitoring the radio frequency signal and generating first sensor signals based on the radio frequency signal;
    a distortion module determining a first distortion value according to a sinusoidal function of the first sensor signals; and
    a first correction circuit (i) generating a first impedance tuning value based on the first distortion value and a first predetermined value, and (ii) providing feedforward control of impedance matching performed within the matching network including outputting the first impedance turning value to one of the power amplifier and the matching network.

2. The radio frequency system of claim 1, the distortion module determining a first distortion value according to at least one of the sinusoidal function and a cross-correlation function of the first sensor signals.

3. The radio frequency system of claim 1, wherein the first correction circuit comprises:
    a first input module generating the first predetermined value;
    a first summer summing the first distortion value and the first predetermined value to generate a first correction value; and
    a tune control module generating the first impedance value based on the first correction value.

4. The radio frequency system of claim 1, wherein the first correction circuit further comprises a tune control module generating the first impedance tuning value in accordance with variable control coefficients.

5. The radio frequency system of claim 4, wherein the first impedance tuning value is generated in accordance with a proportional integral derivative (PID) control function, and the control coefficients are coefficients of the PID control function.

6. The radio frequency system of claim 1, wherein:
    the first correction circuit feeds forward the first impedance tuning value to a tune input of the matching network; and
    the radio frequency system further comprises:
    a second distortion module determining a second distortion value based on the first sensor signals, and
    a second correction circuit (i) generating a second impedance tuning value based on the second distortion value and a load setpoint value, and (ii) feeding forward the second impedance tuning value to a load input of the matching network,
    wherein the first correction circuit and the second correction circuit communicate the respective first impedance tuning value and second impedance tuning value.

7. The radio frequency system of claim 6, further comprising a third correction circuit determining a third impedance tuning value based on the first distortion value and a second predetermined value, wherein the third correction circuit outputs the third impedance tuning value to the power amplifier.

8. The radio frequency system of claim 7, wherein the third correction circuit further comprises a frequency control module, the frequency control module generating the third impedance tuning value in accordance with variable control coefficients.

9. The radio frequency system of claim 8, wherein the third impedance tuning value is generated in accordance with a proportional integral derivative (PID) control function, and the control coefficients are coefficients of the PID control function.

10. The radio frequency system of claim 1, further comprising a variable tuning element to provide a variable impedance.

11. The radio frequency system of claim 10, wherein the variable tuning element is one of a capacitive element or a frequency control circuit, and wherein the variable tuning element includes an initial value.

12. The radio frequency system of claim 1, wherein:
    the first correction circuit outputs the first impedance tuning value to the power amplifier; and
    the power amplifier generates the radio frequency signal based on the first impedance tuning value.

13. The radio frequency system of claim 12, wherein the power amplifier adjusts frequency of the radio frequency signal based on the first impedance tuning value.

14. The radio frequency system of claim 13, further comprising a power control module that regulates power of the power amplifier, wherein the power amplifier adjusts the frequency while power of the power amplifier is regulated by the power control module to coalesce power regulation and frequency tuning.

15. The radio frequency system of claim 14, wherein the power of the power amplifier is regulated during a first time slot of the radio frequency system, and the frequency is adjusted during a second time slot of the radio frequency system.

16. The radio frequency system of claim 14, further comprising a third correction circuit including a frequency control module that while updating the frequency accelerates through an operating bandwidth of the radio frequency system to converge the frequency to a frequency set point associated with a maximum power transfer between the radio frequency power system and a load, wherein the set point is variable or fixed.

17. The radio frequency system of claim 1, further comprising a frequency control module, the frequency control module generating a first control module response in accordance with variable control coefficients.

18. The radio frequency system of claim 17, wherein the first control module response is generated in accordance with a proportional integral derivative (PID) control function, and the control coefficients are coefficients of the PID control function.

19. The radio frequency system of claim 1, wherein the matching network matches an impedance of a load on the power amplifier with an impedance of the transmission line.

20. The radio frequency system of claim 1, wherein the sinusoidal function includes one of:
    a dot product varying in accordance with selected ones of the first sensor signals, and a magnitude varying in accordance with selected ones of the first sensor signals;

filtered quadrature components varying in accordance with selected ones of the first sensor signals; or sinusoidal components varying in accordance with selected ones of the first sensor signals.

21. The radio frequency system of claim 20, wherein:
the first sensor signals include a voltage signal and a current signal;
the voltage signal indicates a voltage of the radio frequency signal; and
the current signal indicates a current of the radio frequency signal.

22. The radio frequency system of claim 21, wherein the sinusoidal function includes the dot product of the voltage signal and the current signal, a magnitude of the voltage signal, and a magnitude of the current signal.

23. The radio frequency system of claim 20, wherein:
the first sensor signal includes a directional coupler sensor detecting a reverse power reflected back from the matching network to the power amplifier; and
the radio frequency system further comprises a second directional coupler sensor detecting a forward power provided to the transmission line by the power amplifier.

24. The radio frequency system of claim 23, wherein the sinusoidal function includes a dot product of the reverse power and the forward power, a magnitude of the reverse power, and a magnitude of the forward power.

25. The radio frequency system of claim 1, wherein the first distortion value is generated based on a dot product of the first sensor signals and magnitudes of the first sensor signals.

26. The radio frequency system of claim 1, wherein the first distortion value is generated based on a ratio of magnitudes of the first sensor signals.

27. The radio frequency system of claim 1, further comprising:
a second correction circuit (i) generating a second impedance tuning value based on a second distortion value and a load setpoint value, and (ii) feeding forward the second impedance tuning value to a load input of the matching network; and
a third correction circuit determining a third impedance tuning value based on the first distortion value and a second predetermined value, wherein the third correction circuit outputs the third impedance tuning value to the power amplifier.

28. The radio frequency system of claim 27 wherein:
the first impedance tuning value effects a real component in a complex plane; and
the second and third impedance tuning values effect an imaginary component in the complex plane.

29. The radio frequency system of claim 27, wherein the first, second, and third impedance tuning values adjust the tune of a first capacitance in the matching network, the tune of a second capacitance in the matching network, and the frequency of the power amplifier, respectively.

30. The radio frequency system of claim 27, wherein the first impedance tuning value is adjusted, followed by the second impedance tuning value being adjusted, followed by the third impedance tuning being adjusted.

31. The radio frequency system of claim 29, wherein adjusting the first and second impedance tuning values enables control in a first operating space, and adjusting the second and third impedance tuning values enables control in a second operating space, wherein the second operating space is within the first operating space.

32. The radio frequency system of claim 27 wherein:
the first impedance tuning value effects a real component in a complex plane; and
the second and third impedance tuning values effect an imaginary component in the complex plane,
wherein the first, second, and third impedance tuning values enable tuning the radio frequency system to arbitrary points in the complex plane.

33. A radio frequency system comprising:
a power amplifier that outputs a radio frequency signal to a matching network via a transmission line between the power amplifier and the matching network, wherein the radio frequency signal is one of a continuous waveform or a pulsed waveform;
a sensor monitoring the radio frequency signal and generating first sensor signals based on the radio frequency signal;
a distortion module determining a first distortion value according to a sinusoidal function of the first sensor signals; and
a first correction circuit (i) generating a first impedance tuning value based on the first distortion value and a first predetermined value, and (ii) providing feedforward control of impedance matching performed within the matching network including outputting the first impedance tuning value to one of the power amplifier and the matching network.

34. The radio frequency system of claim 33, the distortion module determining a first distortion value according to at least one of the sinusoidal function or a cross-correlation function of the first sensor signals.

35. The radio frequency system of claim 33, wherein the first correction circuit further comprises a tune control module generating the first impedance tuning value in accordance with variable control coefficients.

36. The radio frequency system of claim 33, further comprising a second correction circuit (i) generating a second impedance tuning value based on a second distortion value and a load setpoint value, and (ii) feeding forward the second impedance tuning value to a load input of the matching network, wherein the first correction circuit and second correction circuit communicate the respective first impedance tuning value and second impedance tuning value.

37. The radio frequency system of claim 36, further comprising a third correction circuit determining a third impedance tuning value based on the first distortion value and a second predetermined value, wherein the third correction circuit outputs the third impedance tuning value to the power amplifier.

38. The radio frequency system of claim 37, wherein the third correction circuit further comprises a frequency control module, the frequency control module generating the third impedance tuning value in accordance with variable control coefficients.

39. The radio frequency system of claim 33, wherein the sinusoidal function includes one of:
a dot product varying in accordance with selected ones of the first sensor signals, and a magnitude varying in accordance with selected ones of the first sensor signals;
filtered quadrature components varying in accordance with selected ones of the first sensor signals; or
sinusoidal components varying in accordance with selected ones of the first sensor signals.

40. The radio frequency system of claim 39, wherein:
the first sensor signals include a voltage signal and a current signal;
the voltage signal indicates a voltage of the radio frequency signal; and
the current signal indicates a current of the radio frequency signal.

41. The radio frequency system of claim 40, wherein the sinusoidal function includes the dot product of the voltage signal and the current signal, a magnitude of the voltage signal, and a magnitude of the current signal.

42. The radio frequency system of claim 40, wherein:
the first sensor signal includes a directional coupler sensor detecting a reverse power reflected back from the matching network to the power amplifier; and
the radio frequency system further comprises a second directional coupler sensor detecting a forward power provided to the transmission line by the power amplifier.

43. The radio frequency system of claim 40, wherein the sinusoidal function includes a dot product of a reverse power and a forward power, a magnitude of the reverse power, and a magnitude of the forward power.

44. The radio frequency system of claim 33, wherein the first distortion value is generated based on a dot product of the first sensor signals and magnitudes of the first sensor signals.

45. The radio frequency system of claim 33, wherein the first distortion value is generated based on a ratio of magnitudes of the first sensor signals.

46. The radio frequency system of claim 33, further comprising:
a second correction circuit (i) generating a second impedance tuning value based on a second distortion value and a load setpoint value, and (ii) feeding forward the second impedance tuning value to a load input of the matching network; and
a third correction circuit determining a third impedance tuning value based on the first distortion value and a second predetermined value, wherein the third correction circuit outputs the third impedance tuning value to the power amplifier.

47. The radio frequency system of claim 46 wherein:
the first impedance tuning value effects a real component in a complex plane; and
the second and third impedance tuning values effect an imaginary component in the complex plane.

48. The radio frequency system of claim 46, wherein the first, second, and third impedance tuning values adjust the tune of a first capacitance in the matching network, the tune of a second capacitance in the matching network, and the frequency of the power amplifier, respectively.

49. The radio frequency system of claim 46, wherein the first impedance tuning value is adjusted, followed by the second impedance tuning value being adjusted, followed by the third impedance tuning being adjusted.

50. The radio frequency system of claim 49, wherein adjusting the first and second impedance tuning values enables control in a first operating space, and adjusting the second and third impedance tuning values enables control in a second operating space, wherein the second operating space is within the first operating space.

51. The radio frequency system of claim 48 wherein:
the first impedance tuning value effects a real component in a complex plane; and
the second and third impedance tuning values effect an imaginary component in the complex plane,
wherein the first, second, and third impedance tuning values enable tuning the radio frequency system to arbitrary points in the complex plane.

52. A radio frequency system comprising:
a power amplifier that outputs a radio frequency signal to a matching network via a transmission line between the power amplifier and the matching network;
a first sensor monitoring the radio frequency signal and generating first sensor signals based on the radio frequency signal;
a distortion module determining a first distortion value according to a cross-correlation function of the first sensor signals; and
a first correction circuit (i) generating a first impedance tuning value based on the first distortion value and a first predetermined value, and (ii) providing feedforward control of impedance matching performed within the matching network including outputting the first impedance tuning value to one of the power amplifier and the matching network.

* * * * *